(12) United States Patent
Bitsch et al.

(10) Patent No.: US 10,371,730 B2
(45) Date of Patent: Aug. 6, 2019

(54) BRANCH CURRENT MONITOR WITH CLIENT LEVEL ACCESS

(71) Applicant: Veris Industries, LLC, Tualatin, OR (US)

(72) Inventors: Michael Bitsch, Hillsboro, OR (US); Eric Moon, Sherwood, OR (US)

(73) Assignee: Veris Industries, LLC, Tualatin, OR (US)

( * ) Notice: Subject to any disclaimer, the term of this patent is extended or adjusted under 35 U.S.C. 154(b) by 333 days.

(21) Appl. No.: 15/185,706

(22) Filed: Jun. 17, 2016

(65) Prior Publication Data

US 2017/0185237 A1    Jun. 29, 2017

Related U.S. Application Data

(60) Provisional application No. 62/271,410, filed on Dec. 28, 2015.

(51) Int. Cl.
*G01R 21/133* (2006.01)
*G01R 1/02* (2006.01)

(52) U.S. Cl.
CPC .......... *G01R 21/133* (2013.01); *G01R 1/025* (2013.01)

(58) Field of Classification Search
CPC ....... G06F 3/0481; G01R 21/00; G01R 25/00; G01R 31/08
See application file for complete search history.

(56) References Cited

U.S. PATENT DOCUMENTS

| | | |
|---|---|---|
| 1,100,171 A | 6/1914 | Brown |
| 1,455,263 A | 5/1923 | Oberfell |
| 1,569,723 A | 1/1926 | Dickinson |
| 1,800,474 A | 4/1931 | Scherer |
| 1,830,541 A | 11/1931 | Harris |
| 1,871,710 A | 8/1932 | Lenehan |
| 2,059,594 A | 11/1936 | Massa |
| 2,412,782 A | 12/1946 | Palmer |
| 2,428,613 A | 10/1947 | Boyajian |
| 2,663,190 A | 12/1953 | Ilgenfritz |
| 2,746,295 A | 5/1956 | Lubkin |
| 2,802,182 A | 8/1957 | Godshalk et al. |
| 2,852,739 A | 9/1958 | Hansen |
| 2,943,488 A | 7/1960 | Strobel et al. |
| 3,190,122 A | 6/1965 | Edwards |
| 3,243,674 A | 3/1966 | Gotthold |
| 3,287,974 A | 11/1966 | Ciemochowski |
| 3,374,434 A | 3/1968 | Perry |
| 3,493,760 A | 2/1970 | Hoadley |
| 3,512,045 A | 5/1970 | Tipton et al. |
| 3,584,294 A | 6/1971 | Siwko |
| 3,593,078 A | 7/1971 | Domshy et al. |
| 3,696,288 A | 10/1972 | Carman |
| 3,728,705 A | 4/1973 | Atkins |
| 3,769,548 A | 10/1973 | Pardue |
| 3,772,625 A | 11/1973 | Raupach |
| 3,861,411 A | 1/1975 | Mitchell et al. |

(Continued)

FOREIGN PATENT DOCUMENTS

EP   1531334 A2   5/2005
WO   2016176315 A1   11/2016

*Primary Examiner* — Phenuel S Salomon
(74) *Attorney, Agent, or Firm* — Chernoff, Vilhauer, McClung & Stenzel, LLP

(57) ABSTRACT

A branch current monitor that includes client level access.

7 Claims, 19 Drawing Sheets

(56) References Cited

U.S. PATENT DOCUMENTS

| | | |
|---|---|---|
| 3,955,701 A | 5/1976 | Fisch |
| 4,001,647 A | 1/1977 | Klein et al. |
| 4,001,758 A | 1/1977 | Esper et al. |
| 4,030,058 A | 6/1977 | Riffe et al. |
| 4,048,605 A | 9/1977 | McCollum |
| 4,096,436 A | 6/1978 | Cook et al. |
| 4,107,519 A | 8/1978 | Bicek |
| D249,883 S | 10/1978 | Collins |
| 4,151,578 A | 4/1979 | Bell |
| 4,158,217 A | 6/1979 | Bell |
| 4,158,810 A | 6/1979 | Leskovar |
| 4,177,496 A | 12/1979 | Bell et al. |
| 4,198,595 A | 4/1980 | Milkovic |
| 4,207,604 A | 6/1980 | Bell |
| 4,215,278 A | 7/1980 | Barbier et al. |
| 4,227,419 A | 10/1980 | Park |
| 4,241,237 A | 12/1980 | Paraskevakos et al. |
| 4,249,264 A | 2/1981 | Crochet et al. |
| 4,250,449 A | 2/1981 | Shum |
| 4,253,336 A | 3/1981 | Pietzuch |
| 4,258,348 A | 3/1981 | Belfer et al. |
| 4,297,741 A | 10/1981 | Howell |
| 4,328,903 A | 5/1982 | Baars |
| 4,354,155 A | 10/1982 | Leopold |
| 4,359,672 A | 11/1982 | Hart |
| 4,362,580 A | 12/1982 | Kane et al. |
| 4,363,061 A | 12/1982 | Vaerewyck et al. |
| 4,371,814 A | 2/1983 | Hannas |
| 4,373,392 A | 2/1983 | Nagamoto |
| 4,384,289 A | 5/1983 | Stillwell et al. |
| 4,386,280 A | 5/1983 | Ricaud et al. |
| 4,388,668 A | 6/1983 | Bell et al. |
| 4,393,714 A | 7/1983 | Schmidt |
| 4,398,426 A | 8/1983 | Park et al. |
| 4,408,175 A | 10/1983 | Nelson et al. |
| 4,413,193 A | 11/1983 | Crockett |
| 4,413,230 A | 11/1983 | Miller |
| 4,426,673 A | 1/1984 | Bell et al. |
| 4,432,238 A | 2/1984 | Tward |
| 4,491,790 A | 1/1985 | Miller |
| 4,492,919 A | 1/1985 | Milkovic |
| 4,495,463 A | 1/1985 | Milkovic |
| 4,506,199 A | 3/1985 | Asche |
| 4,558,310 A | 12/1985 | McAllise |
| 4,558,595 A | 12/1985 | Kompelien |
| 4,574,266 A | 3/1986 | Valentine |
| 4,605,883 A | 8/1986 | Cockroft |
| 4,621,532 A | 11/1986 | Takagi et al. |
| 4,660,407 A | 4/1987 | Takami et al. |
| 4,709,339 A | 11/1987 | Fernandes |
| 4,739,229 A | 4/1988 | Heiler, Jr. |
| 4,746,809 A | 5/1988 | Coleman et al. |
| 4,754,365 A | 6/1988 | Kazahaya |
| 4,757,416 A | 7/1988 | Wilkerson |
| 4,758,774 A | 7/1988 | Crawford et al. |
| 4,758,962 A | 7/1988 | Fernandes |
| 4,783,748 A | 11/1988 | Swarztrauber et al. |
| 4,794,327 A | 12/1988 | Fernandes |
| 4,808,910 A | 2/1989 | Kessi |
| D301,331 S | 5/1989 | Rhodin |
| 4,851,803 A | 7/1989 | Hahn |
| 4,855,671 A | 8/1989 | Fernandes |
| 4,874,904 A | 10/1989 | DeSanti |
| 4,890,318 A | 12/1989 | Crane et al. |
| 4,926,105 A | 5/1990 | Mischenko |
| 4,939,451 A | 7/1990 | Baran et al. |
| 4,944,187 A | 7/1990 | Frick et al. |
| 4,956,588 A | 9/1990 | Ming |
| 4,970,476 A | 11/1990 | Kitagawa |
| 4,972,167 A | 11/1990 | Fujioka |
| 4,992,709 A | 2/1991 | Griffin |
| 4,999,575 A | 3/1991 | Germer |
| 5,003,278 A | 3/1991 | May |
| 5,006,846 A | 4/1991 | Granville |
| 5,014,908 A | 5/1991 | Cox |
| 5,039,970 A | 8/1991 | Cox |
| 5,051,601 A | 9/1991 | Atobe et al. |
| 5,066,904 A | 11/1991 | Bullock |
| 5,079,510 A | 1/1992 | Komatsu et al. |
| D323,815 S | 2/1992 | Bouteiller |
| 5,099,193 A | 3/1992 | Moseley et al. |
| 5,122,735 A | 6/1992 | Porter et al. |
| 5,148,348 A | 9/1992 | White |
| 5,181,026 A | 1/1993 | Granville |
| 5,196,784 A | 3/1993 | Estes, Jr. |
| D335,488 S | 5/1993 | Suzuki et al. |
| 5,223,790 A | 6/1993 | Baran et al. |
| 5,267,122 A | 11/1993 | Glover et al. |
| 5,296,819 A | 3/1994 | Kuroiwa et al. |
| 5,311,138 A | 5/1994 | Ott et al. |
| 5,317,274 A | 5/1994 | Nakagawa et al. |
| 5,323,256 A | 6/1994 | Banks |
| 5,337,206 A | 8/1994 | Kadah |
| 5,365,462 A | 11/1994 | McBean |
| D354,945 S | 1/1995 | Dellavecchia et al. |
| 5,384,712 A | 1/1995 | Oravetz et al. |
| 5,385,060 A | 1/1995 | Wang |
| 5,391,983 A | 2/1995 | Lusignan et al. |
| 5,397,970 A | 3/1995 | Rowlette et al. |
| 5,410,920 A | 5/1995 | Westwick |
| 5,426,360 A | 6/1995 | Maraio et al. |
| 5,430,438 A | 7/1995 | Joos et al. |
| 5,444,183 A | 8/1995 | Gehrs et al. |
| 5,450,765 A | 9/1995 | Stover |
| 5,467,012 A | 11/1995 | Nystrom |
| 5,471,359 A | 11/1995 | Simpson et al. |
| 5,473,234 A | 12/1995 | Richardson |
| 5,548,209 A | 8/1996 | Lusignan et al. |
| 5,548,527 A * | 8/1996 | Hemminger ......... G01R 21/133 |
| | | 702/62 |
| 5,563,506 A | 10/1996 | Fielden et al. |
| 5,572,073 A | 11/1996 | Burgess et al. |
| 5,578,927 A | 11/1996 | Saft |
| 5,592,989 A | 1/1997 | Lynn et al. |
| 5,596,652 A | 1/1997 | Piatek et al. |
| 5,604,315 A | 2/1997 | Briefer et al. |
| 5,612,499 A | 3/1997 | Andrew et al. |
| 5,631,554 A * | 5/1997 | Briese .................. G01D 3/08 |
| | | 324/76.77 |
| 5,677,476 A | 10/1997 | McCarthy et al. |
| 5,705,989 A | 1/1998 | Cota et al. |
| 5,712,558 A | 1/1998 | Saint-Cyr |
| 5,753,983 A | 5/1998 | Dickie et al. |
| 5,784,249 A | 7/1998 | Pouliot |
| 5,808,846 A | 9/1998 | Holce et al. |
| 5,844,138 A | 12/1998 | Cota |
| 5,861,683 A | 1/1999 | Engel et al. |
| 5,880,677 A | 3/1999 | Lestician |
| 5,880,918 A | 3/1999 | Horbelt et al. |
| 5,905,439 A | 5/1999 | McIntyre |
| 5,909,087 A | 6/1999 | Bryde et al. |
| 5,920,190 A | 7/1999 | Peterson et al. |
| 5,920,191 A | 7/1999 | Maniero et al. |
| 5,922,939 A | 7/1999 | Cota |
| 5,994,892 A | 11/1999 | Turino et al. |
| 5,995,911 A | 11/1999 | Hart |
| D419,964 S | 2/2000 | Holce et al. |
| 6,020,702 A | 2/2000 | Farr |
| 6,029,524 A | 2/2000 | Klauder et al. |
| 6,044,430 A | 3/2000 | MacDonald |
| 6,046,550 A | 4/2000 | Ference et al. |
| 6,064,192 A * | 5/2000 | Redmyer ............. G01R 15/186 |
| | | 324/117 H |
| 6,091,023 A | 7/2000 | O'Donnell |
| 6,122,972 A | 9/2000 | Crider |
| 6,124,791 A | 9/2000 | Wolf |
| D431,534 S | 10/2000 | Holce et al. |
| 6,133,709 A | 10/2000 | Puchianu |
| 6,133,723 A | 10/2000 | Feight |
| 6,137,418 A | 10/2000 | Zuercher et al. |
| 6,146,109 A | 11/2000 | Davis et al. |
| 6,236,949 B1 | 5/2001 | Hart |
| 6,269,317 B1 | 7/2001 | Schachner et al. |

(56) References Cited

U.S. PATENT DOCUMENTS

| | | |
|---|---|---|
| 6,289,267 B1 * | 9/2001 | Alexander ............... H02H 3/00 700/286 |
| 6,292,717 B1 * | 9/2001 | Alexander ......... G01R 19/2513 340/6.1 |
| 6,308,140 B1 | 10/2001 | Dowling et al. |
| 6,330,516 B1 * | 12/2001 | Kammeter ......... G01R 19/2513 702/122 |
| 6,331,821 B1 | 12/2001 | Holce et al. |
| 6,344,951 B1 | 2/2002 | Sato et al. |
| 6,351,206 B1 | 2/2002 | Schweiger et al. |
| 6,373,238 B2 | 4/2002 | Lewis et al. |
| 6,377,430 B2 | 4/2002 | Holce et al. |
| 6,380,696 B1 | 4/2002 | Sembhi et al. |
| 6,384,946 B1 | 5/2002 | Pitsch et al. |
| 6,404,166 B1 | 6/2002 | Puchianu |
| 6,414,241 B1 | 7/2002 | Carter |
| D466,078 S | 11/2002 | Paul et al. |
| 6,496,378 B2 | 12/2002 | Holce et al. |
| 6,504,357 B1 | 1/2003 | Hemminger et al. |
| 6,504,695 B1 | 1/2003 | Holce et al. |
| 6,549,859 B1 | 4/2003 | Ward |
| 6,591,482 B1 | 7/2003 | Fleege et al. |
| D478,313 S | 8/2003 | Bowman |
| 6,615,147 B1 | 9/2003 | Jonker et al. |
| 6,636,028 B2 | 10/2003 | Lavoie et al. |
| 6,657,424 B1 | 12/2003 | Voisine et al. |
| 6,737,854 B2 | 5/2004 | Bruno et al. |
| 6,756,776 B2 | 6/2004 | Perkinson et al. |
| 6,774,803 B1 | 8/2004 | Tiffin |
| 6,809,509 B2 * | 10/2004 | Bruno .................. G01R 15/186 324/107 |
| 6,815,942 B2 | 11/2004 | Randall et al. |
| 6,825,771 B2 | 11/2004 | Bruno et al. |
| 6,856,515 B2 | 2/2005 | Holce et al. |
| 6,861,683 B2 | 3/2005 | Rissing et al. |
| 6,871,827 B2 | 3/2005 | Petak et al. |
| 6,888,712 B2 | 5/2005 | Holce et al. |
| 6,889,271 B1 | 5/2005 | Germer et al. |
| 6,917,839 B2 * | 7/2005 | Bickford ............ G05B 23/0275 700/30 |
| 6,937,003 B2 | 8/2005 | Bowman et al. |
| 6,950,292 B2 | 9/2005 | Holce et al. |
| 6,988,043 B1 | 1/2006 | Randall |
| 7,006,934 B2 | 2/2006 | Jonker et al. |
| 7,053,497 B2 | 5/2006 | Sodemann et al. |
| 7,157,899 B2 | 1/2007 | Bruno |
| 7,161,345 B2 | 1/2007 | Bruno |
| 7,193,428 B1 | 3/2007 | Baron et al. |
| 7,212,930 B2 | 5/2007 | Bruno |
| 7,221,145 B2 | 5/2007 | Bowman et al. |
| 7,230,414 B2 | 6/2007 | Bruno |
| 7,239,810 B2 | 7/2007 | Seely et al. |
| 7,274,187 B2 | 9/2007 | Loy |
| 7,282,889 B2 | 10/2007 | Freed et al. |
| 7,310,049 B2 | 12/2007 | Bowman |
| 7,312,686 B2 | 12/2007 | Bruno |
| 7,312,964 B2 | 12/2007 | Tchernobrivets |
| 7,330,022 B2 | 2/2008 | Bowman et al. |
| 7,333,345 B2 | 2/2008 | Holce et al. |
| 7,352,287 B2 | 4/2008 | Rupert |
| 7,359,809 B2 | 4/2008 | Bruno |
| 7,447,603 B2 | 11/2008 | Bruno |
| 7,453,267 B2 | 11/2008 | Westbrock, Jr. et al. |
| 7,474,088 B2 | 1/2009 | Bowman et al. |
| 7,502,698 B2 * | 3/2009 | Uenou .................. G01R 21/133 324/141 |
| 7,652,871 B2 | 1/2010 | Caggiano et al. |
| 7,660,776 B1 * | 2/2010 | Kious .................... G06N 5/025 706/45 |
| 8,085,055 B2 | 12/2011 | Rupert |
| 8,193,803 B2 | 6/2012 | Bose et al. |
| 8,212,548 B2 | 7/2012 | Parker et al. |
| 8,212,549 B2 | 7/2012 | McNulty et al. |
| 8,294,453 B2 | 10/2012 | Bowman |
| 8,405,383 B2 | 3/2013 | Agrawal et al. |
| 8,421,443 B2 | 4/2013 | Bitsch et al. |
| 8,610,438 B1 * | 12/2013 | Sykora ............... G01R 19/2513 307/64 |
| 8,612,792 B2 | 12/2013 | Fu et al. |
| 8,837,118 B2 | 9/2014 | McGrail |
| 8,878,475 B2 | 11/2014 | Bonvin et al. |
| 8,964,360 B2 | 2/2015 | Trout |
| 8,988,062 B2 | 3/2015 | Sykora et al. |
| 9,146,264 B2 | 9/2015 | Cook |
| 9,329,659 B2 | 5/2016 | Cook |
| 9,395,344 B2 | 7/2016 | Sheley |
| 9,424,975 B2 | 8/2016 | Cook et al. |
| 9,577,443 B2 | 2/2017 | Gach et al. |
| 9,588,148 B2 | 3/2017 | Cook et al. |
| 9,607,749 B2 | 3/2017 | Cook et al. |
| 2001/0040446 A1 | 11/2001 | Lapinksi |
| 2004/0227503 A1 | 11/2004 | Bowman |
| 2005/0240362 A1 | 10/2005 | Randall |
| 2006/0085144 A1 | 4/2006 | Slota et al. |
| 2006/0103548 A1 | 5/2006 | Borkowski |
| 2006/0164096 A1 | 7/2006 | Kwon |
| 2006/0181242 A1 | 8/2006 | Freed |
| 2006/0238932 A1 * | 10/2006 | Westbrock, Jr. ...... H02H 1/0038 361/42 |
| 2007/0010916 A1 * | 1/2007 | Rodgers .................... H02J 3/14 700/295 |
| 2007/0153438 A1 | 7/2007 | Caggiano |
| 2008/0303511 A1 | 12/2008 | Grno |
| 2009/0115400 A1 | 5/2009 | Hunter |
| 2009/0115620 A1 | 5/2009 | Hunter |
| 2009/0295370 A1 | 6/2009 | Parker |
| 2010/0030521 A1 * | 2/2010 | Akhrarov ............... G06K 9/622 702/182 |
| 2010/0042372 A1 * | 2/2010 | Carter .................... G01D 4/004 702/189 |
| 2010/0117626 A1 | 5/2010 | Wertz et al. |
| 2010/0176960 A1 | 7/2010 | Bitsch |
| 2010/0207604 A1 | 8/2010 | Bitsch |
| 2010/0235122 A1 | 9/2010 | McCrea |
| 2010/0308792 A1 | 12/2010 | Rupert |
| 2011/0098985 A1 | 4/2011 | Lawson |
| 2011/0181124 A1 * | 7/2011 | Uesaka .................... H04Q 9/00 307/113 |
| 2012/0112681 A1 | 5/2012 | Bonvin |
| 2012/0221278 A1 * | 8/2012 | Cook .................... G01R 21/133 702/107 |
| 2012/0235667 A1 | 9/2012 | Agrawal et al. |
| 2013/0024714 A1 | 1/2013 | Fu et al. |
| 2013/0027818 A1 | 1/2013 | McGrail |
| 2013/0144545 A1 | 6/2013 | Fu et al. |
| 2013/0158910 A1 * | 6/2013 | Chuang ............... G01R 21/133 702/62 |
| 2013/0294014 A1 | 11/2013 | Irons |
| 2014/0184198 A1 * | 7/2014 | Cook .................... G01R 21/133 324/107 |
| 2014/0239964 A1 | 8/2014 | Gach et al. |
| 2015/0028848 A1 | 1/2015 | Lynch et al. |
| 2015/0293549 A1 | 10/2015 | Lal et al. |
| 2016/0349310 A1 * | 12/2016 | Hayashi ............... G01R 31/282 |

* cited by examiner

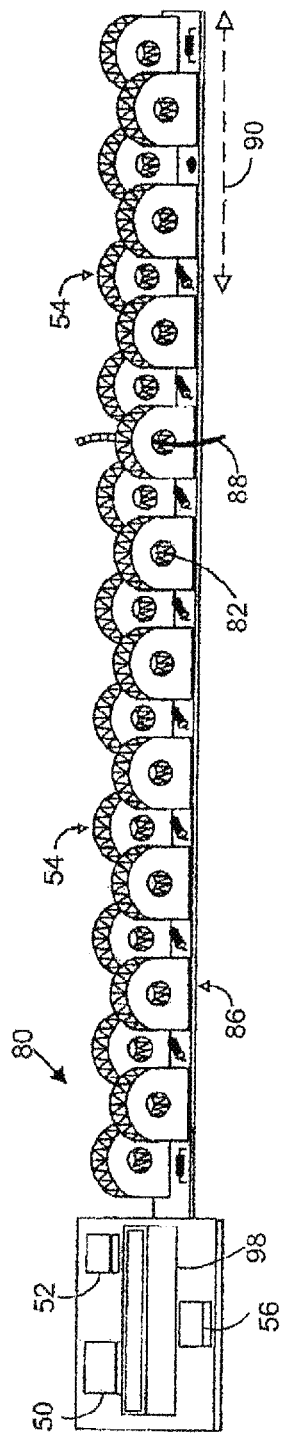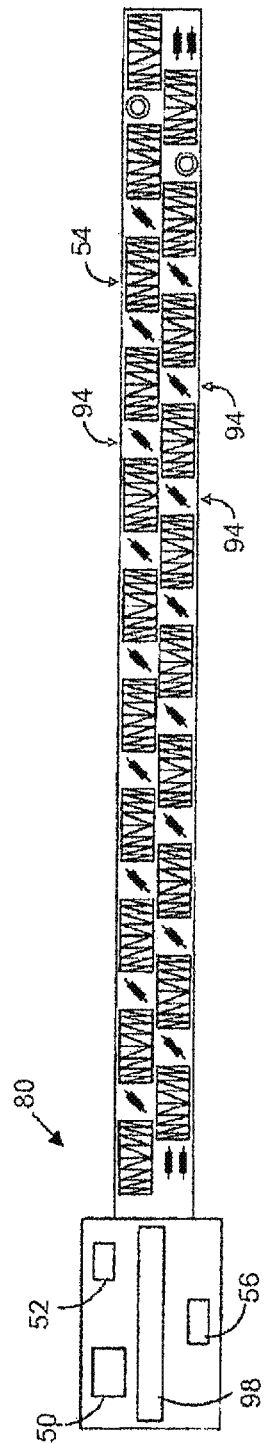

BRANCH CURRENT MONITOR WITH CLIENT LEVEL ACCESS

CROSS-REFERENCE TO RELATED APPLICATIONS

This application claims the benefit of U.S. Provisional App. No. 62/271,410, filed Dec. 28, 2015.

BACKGROUND OF THE INVENTION

The present invention relates to a branch current monitor and, more particularly, to a system for reconfiguring a branch current monitor.

The total power consumption of a building or other facility is monitored by the electric utility with a power meter located between the utility's distribution transformer and the facility's power distribution panel. However, in many instances it is desirable to sub-meter or attribute the facility's power usage and cost to different occupancies, buildings, departments, or cost centers within the facility or to monitor the power consumption of individual loads or groups of loads, such as motors, lighting, heating units, cooling units, machinery, etc. These single phase or multi-phase electrical loads are typically connected to one or more of the branch circuits that extend from the facility's power distribution panel. While a power meter may be installed at any location between a load and the distribution panel, it is often advantageous to install a power meter capable of monitoring a plurality of circuits proximate the power distribution panel to provide centralized monitoring of the various loads powered from the panel.

Flexibility has favored adoption of digital branch current monitors incorporating data processing systems that can monitor a plurality of circuits and determine a number of parameters related to electricity consumption by the individual branch circuits or groups of circuits. A branch current monitor for measuring electricity consumption by respective branch circuits comprises a plurality of voltage and current transducers that are periodically read by the monitor's data processing unit which, in a typical branch current monitor, comprises one or more microprocessors or digital signal processors (DSP). For example, a branch current monitor from Veris Industries, Inc. enables up to ninety circuits to be monitored with a single meter and utilizes the MODBUS® RTU network communication interface to enable remote monitoring as part of a building or facility management system. The data processing unit periodically reads and stores the outputs of the transducers quantifying the magnitudes of current and voltage samples and, using that data, calculates the current, voltage, power, and other electrical parameters, such as active power, apparent power and reactive power that quantify the distribution and consumption of electricity. The calculated parameters are typically output to a display for immediate viewing or transmitted from the meter's communication interface to another data processing system, such as a building management computer for remote display or further processing, for example formulating instructions to the facility's automated equipment.

The voltage transducers of digital branch current monitors commonly comprise a voltage divider network that is connected to a conductor in which the voltage will be measured. The power distribution panel provides a convenient location for connecting the voltage transducers because typically each phase of the electricity is delivered to the power distribution panel on a separate bus bar and the voltage and phase is the same for all loads attached to the respective bus bar. Interconnection of a voltage transducer and the facility's wiring is facilitated by wiring connections in the power distribution panel, however, the voltage transducer(s) can be connected anywhere in the wiring that connects the supply and a load, including at the load's terminals.

The current transducers of digital power meters typically comprise current transformers that encircle each of the power cables that connect each branch circuit to the bus bar(s) of the distribution panel. Bowman et al., U.S. Pat. No. 6,937,003 B2, discloses a branch current monitoring system that includes a plurality of current transformers mounted on a common support facilitating installation of a branch current monitor in a power distribution panel. Installation of current transformers in electrical distribution panels is simplified by including a plurality of current transformers on a single supporting strip which can be mounted adjacent to the lines of circuit breakers in the panel. The aforementioned branch current monitor from Veris Industries, Inc. is commonly used to monitor up to four strips of current sensors; each comprising 21 current transformers on a common support. In addition, the branch current monitor provides for eight auxiliary current transformer inputs for sensing the current flow in two 3-phase mains with two neutrals and six voltage connections enabling voltage sensing in six bus bars of two 3-phase mains.

While physical installation of the branch current monitor is simplified by mounting the branch circuit current transformers on common supports it can be problematic to maintain a suitable mapping of all the different sensor inputs to be associated with particular client accounts.

What is desired, therefore, is a simplified system for maintaining a suitable mapping for all the different sensor inputs associated with particular clients.

BRIEF DESCRIPTION OF THE DRAWINGS

FIG. 2 is a perspective view of a current transformer strip for a branch current monitor.

FIG. 3 is a top view of the current transformer strip of FIG. 2.

DETAILED DESCRIPTION OF PREFERRED EMBODIMENTS

Figure 1:
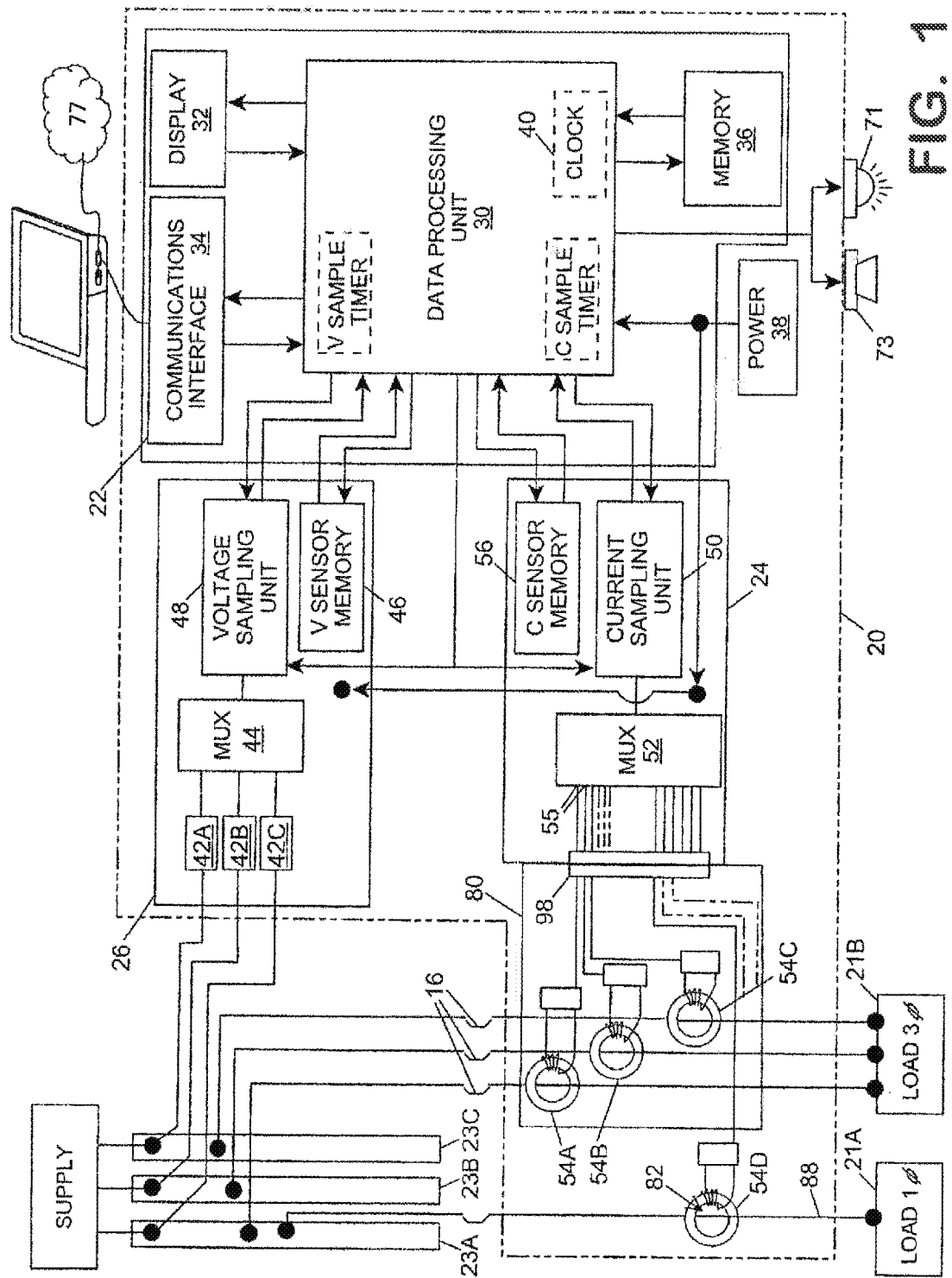
FIG. 1 is a block diagram of an exemplary branch current monitor.

Referring in detail to the drawings where similar parts are identified by like reference numerals, and, more particularly to FIG. 1, a branch current monitor 20 arranged to monitor the voltage and current in a plurality of branch circuits comprises, generally, a data processing module 22, a current module 24 and a voltage module 26. The data processing module 22 comprises a data processing unit 30 which, typically, comprises at least one microprocessor or digital signal processor (DSP). The data processing unit 30 reads and stores data received periodically from the voltage module and the current module, and uses that data to calculate the current, voltage, power and other electrical parameters that are the meter's output. The resulting electrical parameters may be output to a display 32 for viewing at the meter or output to a communications interface 34 for transmission to another data processing system, such as a building management computer, for remote display or use in automating or managing facility functions. The data processing module may also include a memory 36 in which the programming instructions for the data processing unit and the data manipulated by the data processing unit may be stored. In addition, the branch current monitor typically includes a power supply 38 to provide power to the data processing unit and to the voltage and current modules.

The voltage module 26 includes one or more voltage transducers 42 each typically comprising a resistor network, a voltage sampling unit 48 to sample the output of the voltage transducers and convert the analog measurements to digital data suitable for use by the data processing unit and a multiplexer 44 that periodically connects the voltage sampling unit to selected ones of the voltage transducers enabling periodic sampling of the magnitude of the voltage at each of the voltage transducers. Typically, each phase of the electricity supplied to a distribution panel is connected to a bus bar 23 to which are connected the circuit breakers 16 that provide a conductive interconnection to each of the respective loads, by way of examples, a single-phase load 21A and a three-phase load 21B. Since the voltage and phase supplied to all commonly connected loads is the same, a meter for measuring three-phase power typically includes three voltage transducers 42A, 42B, 42C each connected to a respective bus bar 23A, 23B, 23C. A clock 40, which may be included in the data processing unit, provides periodic timing signals to trigger sampling of the outputs of the voltage transducers by the voltage sampling unit. The voltage module may also include a voltage sensor memory 46 in which voltage sensor characterization data, including relevant specifications and error correction data for the voltage transducers are stored. If a portion of the voltage module requires replacement, a new voltage module comprising a voltage sensor memory containing sensor characterization data for the transducers of the new module can be connected to the data processing unit. The data processing unit reads the data contained in the voltage sensor memory and applies the sensor characterization data when calculating the voltage from the transducer data output by the replacement voltage module.

The current module 24 typically comprises a current sampling unit 50, a multiplexer 52 and a plurality of current transducers 54 communicatively connected to respective sensor positions 55 of the current module. The multiplexer 52 sequentially connects the sampling unit to the respective sensor positions enabling the sampling unit to periodically sample the output of each of the current transducers 54. The current sampling unit comprises an analog-to-digital converter to convert the analog sample at the output of a current transducer selected by the multiplexer, to a digital signal for acquisition by the data processing unit. The clock 40 also provides the periodic timing signal that triggers sampling of the current transducer outputs by the current sampling unit. The current module may also include a current sensor memory 56 in which are stored characterization data for the current transducers comprising the module. The characterization data may include transducer identities; relevant specifications, such as turns ratio; and error correction factors, for examples equations or tables enabling the phase and ratio errors to be related to a current permitting correction for magnetization induced errors. The characterization data may also include the type of transducers, the number of transducers, the arrangement of transducers and the order of the transducers' attachment to the respective sensor positions of the current module. At start up, the data processing unit queries the current sensor memory to obtain characterization data including error correction factors and relevant specifications that are used by the data processing unit in determining the monitor's output.

Figure 4:
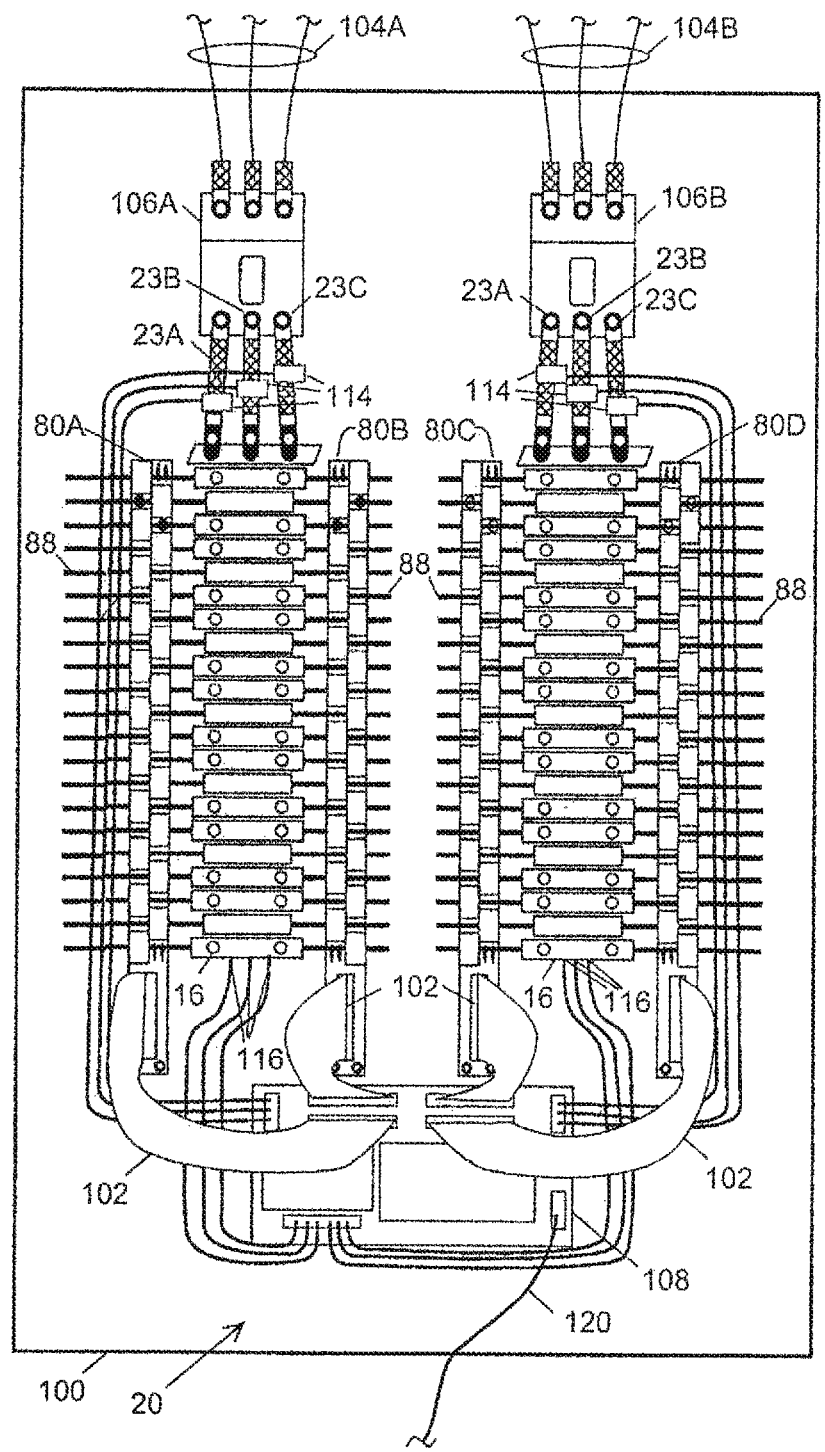
FIG. 4 is a front view of an exemplary electrical distribution panel and branch current monitor.

Referring also to FIGS. 2, 3, and 4, monitoring current in a plurality of branch circuits requires a plurality of current transducers, each one encircling one of the branch power cable(s) 88 that connect the power distribution panel to the load(s) of the respective branch circuit. Current sensing may be performed by an individual current sensor, such as the current transformer 54D, which is connected to the current module. On the other hand, a branch current monitor may comprise one or more sensor strips 80 each comprising a plurality of current sensors attached to a common support, such as sensors 54A, 54B, 54C. The sensors 54 are preferably current transformers but other types of sensors may be used, inclusive of split-core transformers. Each current transformer comprises a coil of wire wound on the cross-section of a toroidal metallic or non-metallic core. The toroidal core is typically enclosed in a plastic housing that includes an aperture 82 enabling the power cable 88 to be extended through the central aperture of the core. The openings 82 defined by the toroidal cores of the transformers are preferably oriented substantially parallel to each other and oriented substantially perpendicular to the longitudinal axis 90 of the support 86. To provide a more compact arrangement of sensors, the sensors 54 may be arranged in substantially parallel rows on the support and the housings of the sensors in adjacent rows may be arranged to partially overlap in the direction of the longitudinal axis of the support. To facilitate routing the power cables of the branch circuits through the cores of the current transformers, the common support maintains the current transformers in a fixed spatial relationship that preferably aligns the apertures of the toroidal coils directly opposite the connections of the power cables 88 and their respective circuit breakers 16 when the strip is installed in a distribution panel 100. For protection from electrical shock, a transient voltage suppressor 94 may be connected in parallel across the output terminals of each sensor to limit the voltage build up at the terminals when the terminals are open circuited.

The transducer strip 80 may include the current sensor memory 56 containing characterization data for the current transformers mounted on the support 86. The current sensor memory may also include characterization data for the transducer strip enabling the data processing unit to determine whether a transducer strip is compatible with the remainder of the meter and whether the strip is properly connected to the data processing module. Improper connection or installation of an incompatible transducer strip may cause illumination of signaling lights or a warning message on the meter's display. In addition. the transducer strip 80 may comprise a current module of the power meter with one or more current transformers 54, the multiplexer 52, the current sampling unit 50 and the current sensor memory all mounted on the support 86. A connector 98 provides a terminus for a communication link 102 connecting the current transducer strip (current module) to the data processing module 22.

The branch current monitor may also include one or more errant current alarms to signal an operator or data processing system that manages the facility or one or more of its operations of an errant current flow in one of the monitored branch circuits. When a current having a magnitude greater or lesser than a respective alarm current limit is detected in one of the branch circuits an alarm annunciator is activated to notify the operator or another data processing system of the errant current flow. An alarm condition may be announced in one or more ways, including, without limitation, periodic or steady illumination of a light 71, sounding of an audible alarm 73, display of a message on the meter's display 32 or transmission of a signal from the communications interface 34 to a remote computer or operator.

A commercial power distribution panel commonly supplies a substantial number of branch circuits and a branch current monitor for a distribution panel typically includes at least an equal number of current transformers. Referring to FIG. 4, an exemplary electrical distribution panel includes two three-phase mains 104A, 104B which respectively are connected to main circuit breakers 106A, 106B. Each of the phases of each main is connected to a bus bar 23A, 23B, 23C. The three bus bars extend behind each of two rows of branch circuit breakers 16 that respectively conductively connect one of the bus bars to a conductor 54 that conducts current to the branch circuit's load(s). A single phase load is connected to single bus bar, a two-phase load is typically connected to two adjacent circuit breakers which are connected to respective bus bars and a three-phase load is typically connected to three adjacent circuit breakers which are each connected to one of the three bus bars. Typically, a two-phase load or three phase load is connected to the appropriate number of adjacent circuit breakers in the same row. The exemplary distribution panel has connections for 84 branch circuit conductors which can be monitored by a branch current monitor produced by Veris Industries, Inc. The branch current monitor monitors the current, voltage and energy consumption of each circuit of the distribution panel, including the mains. The accumulated information can be transmitted to a remote consumer through a communications interface or viewed locally on a local display. Data updates occur approximately every two seconds and as a circuit approaches user configured thresholds, alarms are triggered by the monitor.

As illustrated in FIG. 4, the main acquisition circuit board 108 of the branch current monitor 20 is connectable to as many as four current transformer strips or support units 80A, 80B, 80C, 80D each supporting 21 current transformers. The transformers of the support units are connectable to the data processing unit of the branch current monitor by communication links 102 comprising multi-conductor cables. In addition, the branch current monitor includes connections for six auxiliary current transformers 114 which are typically used to monitor the current in the mains. Since the voltage and phase are common for all loads connected to a bus bar, the branch current monitor also includes six voltage connections 116. A data channel 120 connected to the communications interface enables transmission of data captured by the branch current monitor to other data processing devices that are part of a building management system or other network.

The branch current monitor is installed in the distribution panel by mounting the current transformer strips to the panel adjacent to the rows of circuit breakers and by passing each of the branch circuit conductors 88 through a central aperture in one of the toroidal current transformers and connecting the conductors to the respective circuit breakers. The main acquisition board 108 is attached to the electrical panel and the multi-conductor cables 102 are connected to the board. The mains conductors are passed through the apertures in the auxiliary current transformers and the auxiliary current transformers are connected to the main acquisition board. The voltage taps are connected to respective bus bars and to the main acquisition board. The data channel 120 is connected and the branch current monitor is ready for configuration.

Figure 5:
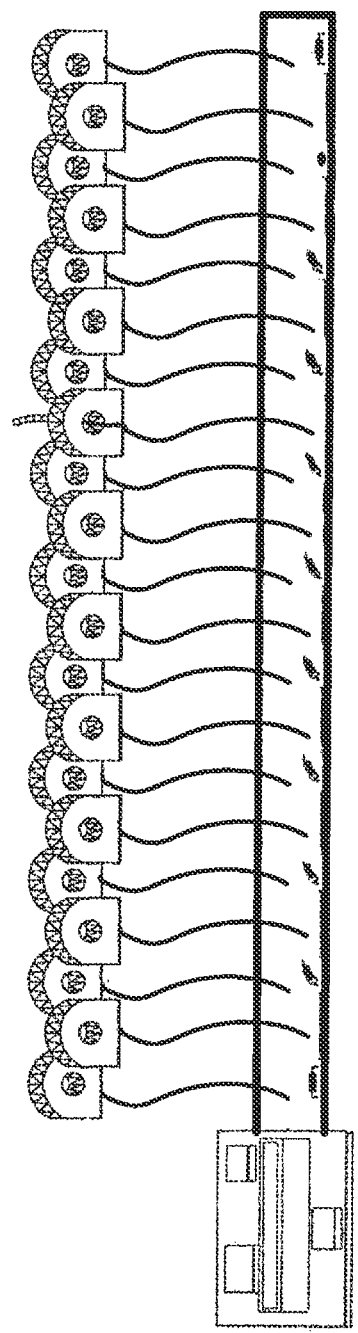
FIG. 5 illustrates a perspective view of another current transformer strip for a branch current monitor.

Referring to FIG. 5, in another embodiment, the strip unit may include a set of connectors at each general location a current sensor is desired. A current transformer may be included with a flexible wire within a connector at the end thereof and a connector on the strip unit. The current transformer is then detachably connectable to the connector of the strip unit. The current transformer may include a solid core or a split core, which is more readily interconnected to existing installed wires. If desired, the strip unit may include one or more power calculation circuits supported thereon. For example, the data from the current transformers may be provided to the one or more power calculation circuits supported thereon together with the sensed voltage being provided by a connector from a separate voltage sensor or otherwise voltage sensed by wires interconnected to the strip unit or signal provided thereto. As a result of this configuration, the connector may provide voltage, current, power, and other parameters to the circuit board.

Figure 6:
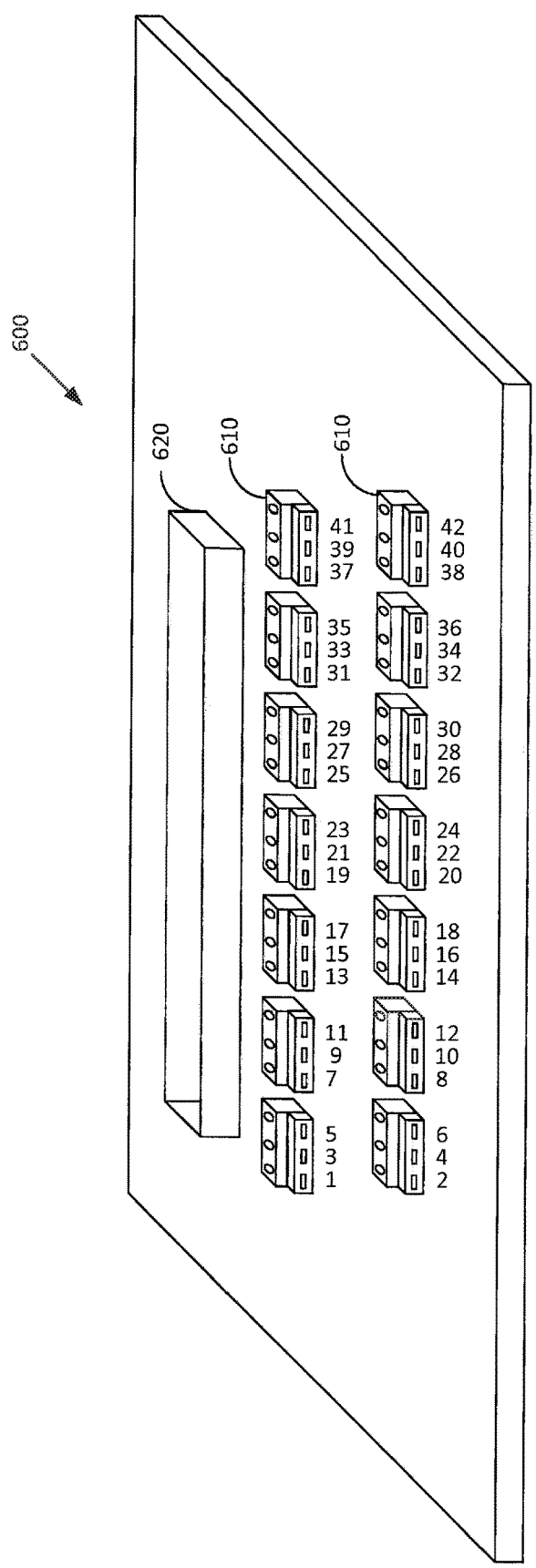
FIG. 6 illustrates a view of a connector board for a branch current monitor.

Referring to FIG. 6, another embodiment includes a set of one or more connector boards 600 in addition to or as an alternative to the strip units. Each of the connector boards may include a set of connectors 610 that may be used to interconnect a current transformer thereto. Each of the connector boards may include a connector 620 that interconnects the connector board to the circuit board 108. Each of the connector boards may be labeled with numbering, such as 1 through 14 or 1 through 42, and 15 through 28 or 42 through 84. Often groups of three connectors are grouped together as a three phase circuit, thus connectors 1 through 42 may be 14 three phase circuits. For example, the connector board with the number of 1 through 14 may be intended to be connected to connector A. For example, the connector board with the numbers of 15 through 28 may be intended to be connected to connector B.

For the branch current monitor to perform its various functions, the various items of hardware comprising the branch current monitor and the power distribution panel and their interconnections are described to the data processing unit of the monitor including the applicable alarm limits established by the user, if included. For example, the current rating of each circuit breaker, the high and low alarm limits for each circuit and any time delays or other characteristics applicable to the alarms may be defined. In addition, the source of the voltage, the phase of the power conducted by each of the branch circuits, may be defined. The information can be entered in a spreadsheet which is mapped to the branch current monitor's memory but entering the data for ninety circuits is fraught with opportunity for typographical errors and other mistakes making configuration of the monitor potentially problematic. Configuring a branch current monitor may be simplified and the chance of errors reduced with a configuration tool including a graphical user interface and a plurality of configuration templates related to relevant elements of the monitor and the monitored circuits. In addition, configuration could be simplified if information stored in branch current monitor by the manufacturer or the configuration of one branch current monitor could be uploaded to the configuration tool for use in configuring another monitor. Moreover, configuration could be simplified if the configuration tool aided in the discovery of the connections in the power distribution system.

As illustrated in FIG. 1, the branch current monitor configuration tool is typically installed on a computer 75, typically, comprising a data processing unit to execute instructions; a memory for storing instructions and data utilized by the data processing unit; one or more input devices, such as a keyboard and a mouse; and a display. The computer 75 may be part of or in communication with a data processing network 77, such as a facility management system, and is communicatively connected to the data processing unit of the branch current monitor through the monitor's communication interface. When the configuration tool is activated, instructions executed by the data processing unit of the computer 75 cause a series of templates to be displayable by the computer enabling an installer of a branch current monitor to enter various attributes of elements of the monitor and the power distribution system, for example, the circuit breakers, which are represented as objects in the configuration tool. The tool also prompts the installer by suggesting values of certain attributes of the various objects. Through communication with the data processing unit of the branch current monitor, the tool can both read attributes of the monitor, the power distribution system and their objects that are stored in the monitor's memory, enabling the configuration of a monitor to be copied to another monitor, and can store attributes of the various objects input by the installer in the memory of the monitor to configure the monitor.

Figure 7:
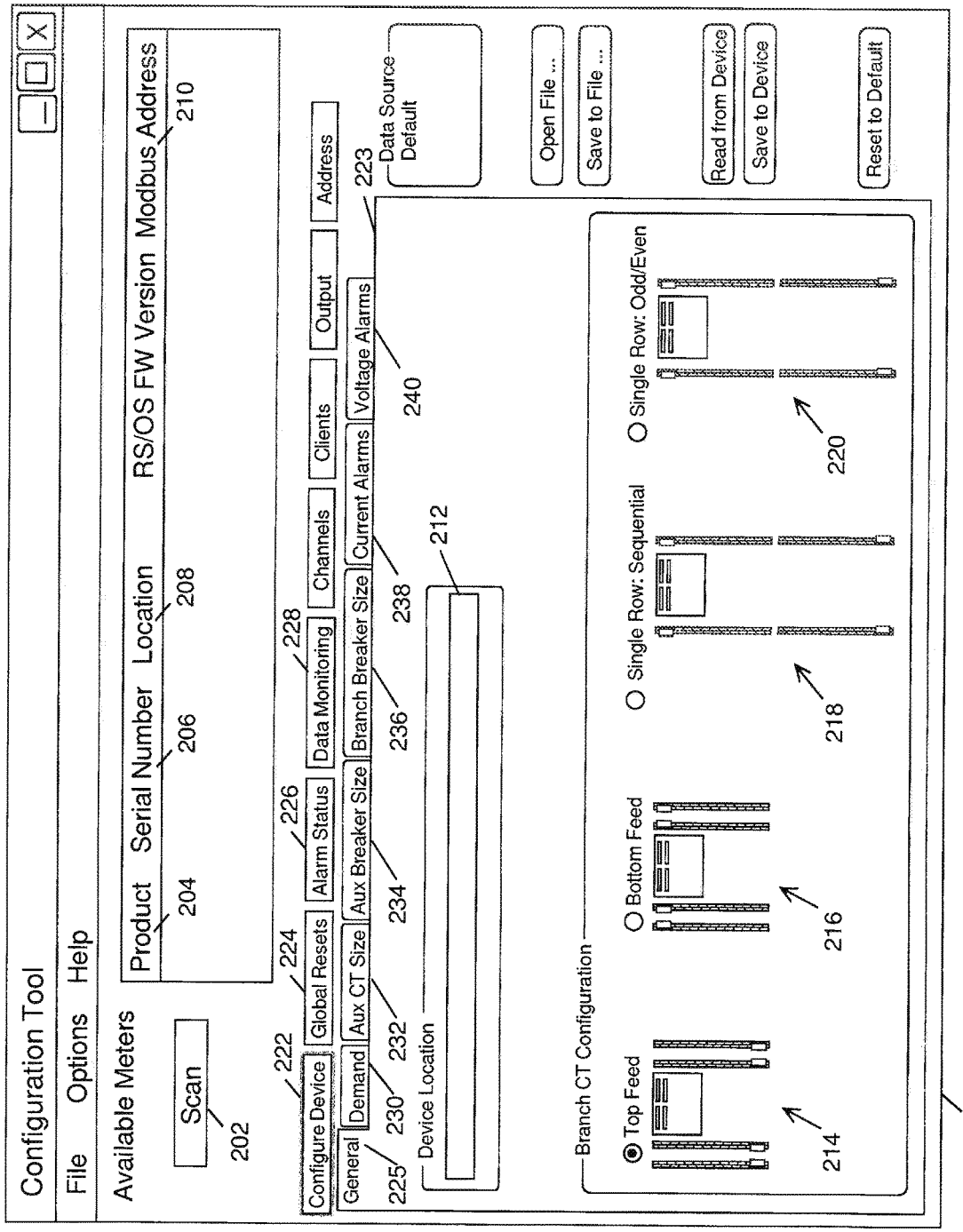
FIG. 7 illustrates a first template of a branch current monitor configuration tool.

Referring to FIG. 7, an initial template 200 of the configuration tool may include an interface enabling specification of general characteristics of the branch current monitor and its relationship to a larger data processing network, such as a building management system. The data processing unit of the exemplary branch current monitor 20 can communicate with another data processing network utilizing the MODBUS.RTM. protocol. Each device in a network utilizing the Modbus protocol has a unique address. By selecting a scan button 202 on the template, the configuration tool can identify other devices making up a larger system by the product name 204, serial number 206, location 208 and Modbus address 210. The initial template includes a plurality of user selectable buttons, including configure device button 222, which, when selected, displays a tabbed file 223 to facilitate the specification of various attributes of the branch current monitor. When the general tab 225 of the initial template is selected, the installer can enter a general description of the branch current monitor that is being configured. Each distribution panel has a location identification 212 which is used in reporting the operation of the branch current monitor and which can be entered from the template. The template also includes icons 214, 216, 218, 220 representing the four possible arrangements of four current transducer strips that can supported by the monitor enabling the installer to easily select and specify the arrangement of the transducer strips in the particular distribution panel.

Other Modbus protocols and non-Modbus protocols may likewise be used, as desired. For example, Modbus RTU, Modbus ASCII, Modbus TCP/IP, Modbut TCP, Modbus over TCP/IP, Modbus over TCP, Modbus over UDP, Modbus Plus, Modbus PEMEX, Enron Modbus may be used, as desired.

Figure 8:
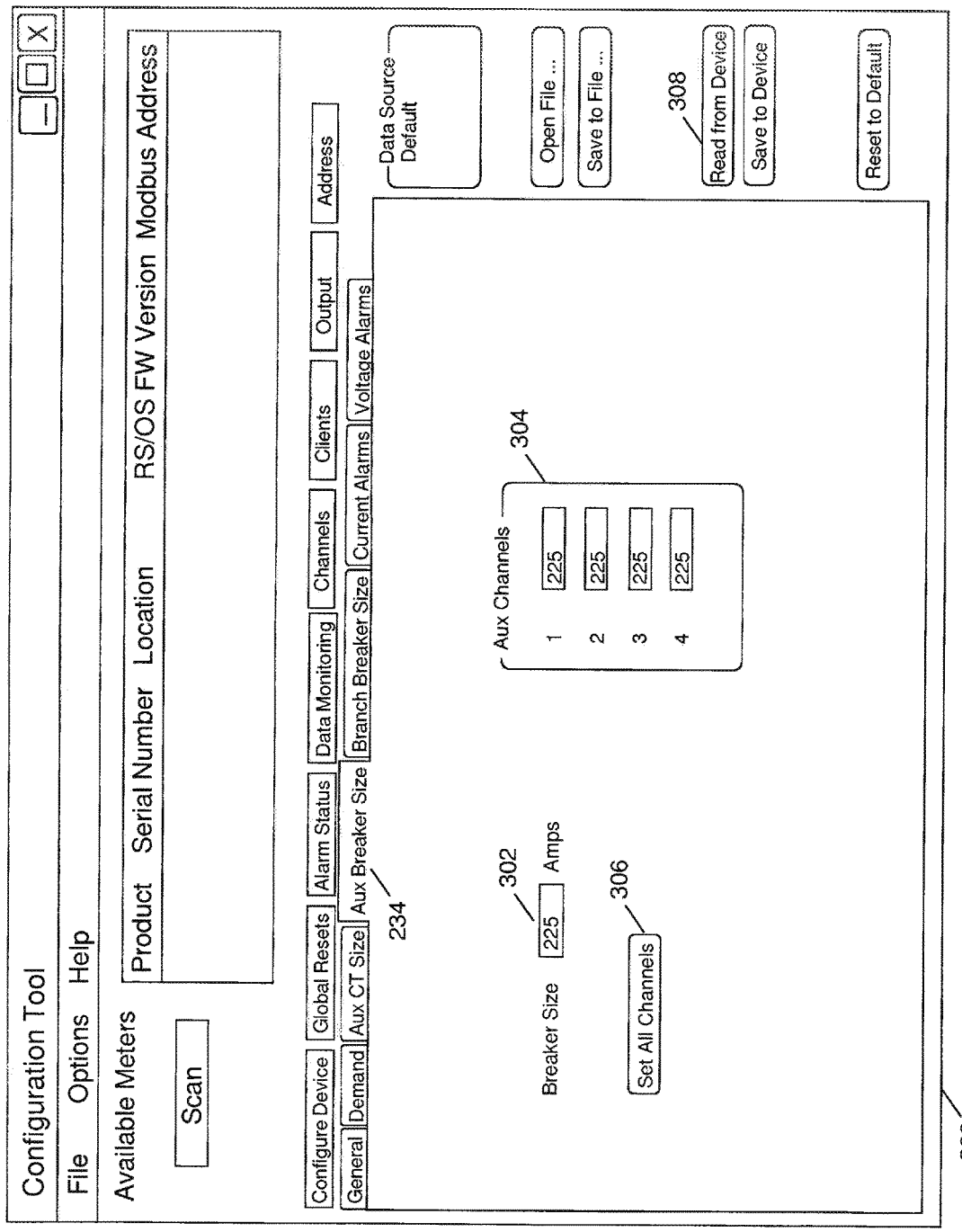
FIG. 8 illustrates a second template of the branch current monitor configuration tool of FIG. 7.

Referring to also FIG. 8, selecting the AUX Breaker Size tab 234 on the initial display 200 displays a template enabling specification of the auxiliary circuit breaker, typically the mains circuit breaker, current rating 300. A typical mains circuit breaker is rated at 225 amps and the configuration tool suggests this size for the mains circuit breakers of the panel. If all the auxiliary circuit breakers have the same current rating the installer can enter the single rating 302 or if the auxiliary circuit breakers have different ratings, for example if one is not used, each auxiliary circuit breaker's rating can be specified separately 304. Clicking a button 306 saves the selected values to the device. On the other hand, if the ratings of the auxiliary circuit breakers are stored in the branch current monitor, for example, in the current sensor memory 56, selecting a button 308 in the template causes the monitor's data processing system to be queried and to upload the ratings into the configuration tool.

Figure 9:
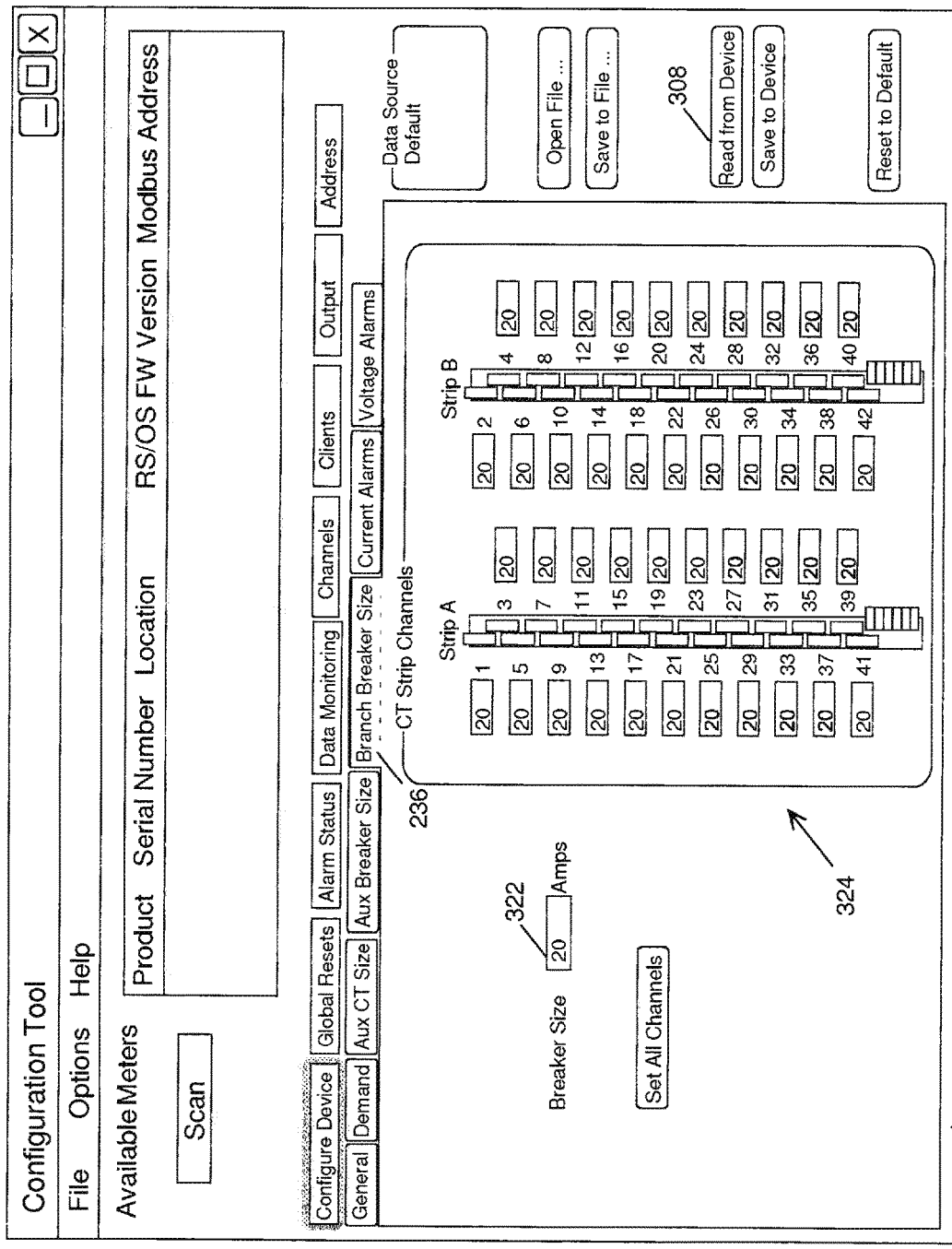
FIG. 9 illustrates a third template of the branch current monitor configuration tool of FIG. 7.

Referring to FIG. 9, selecting the Branch Breaker Size tab 236 on the initial display 200 produces a template enabling specification of the current ratings of the branch circuit breakers 320. If the branch circuit breakers have a common rating, the common rating can be entered 322 or, if various breakers have different ratings or are not used, the rating can be entered for a specific circuit breaker 324. The template suggests a default value for the circuit breaker current rating that is common for branch circuit breakers. If the ratings of the branch circuit breakers are stored in the branch current monitor, for example, in the current sensor memory, the template enables querying the monitor's data processing system to upload the ratings to the configuration tool by selecting a button 308 on the template.

Figure 10:
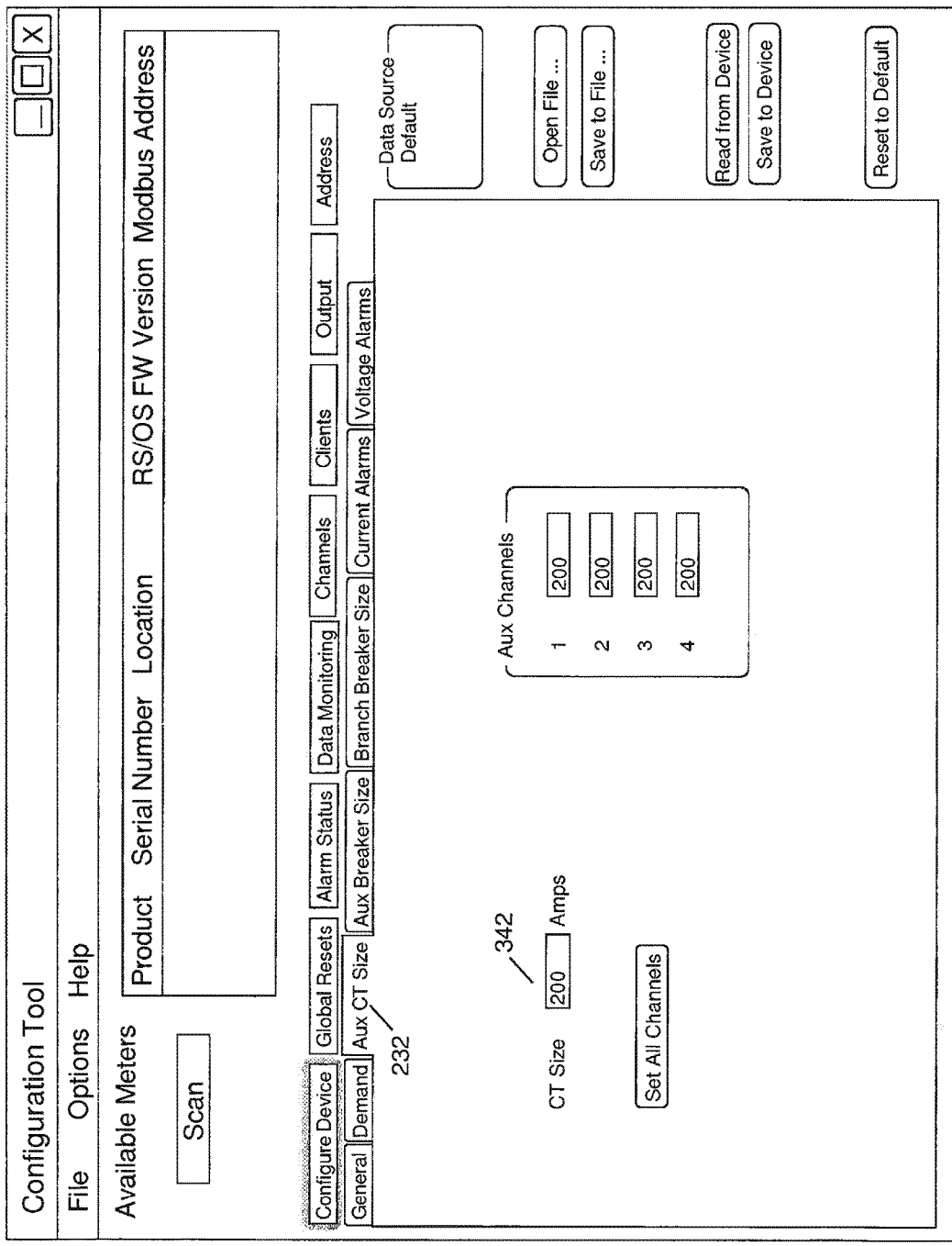
FIG. 10 illustrates a fourth template of the branch current monitor configuration tool of FIG. 7.

Referring to FIG. 10, selecting the AUX CT Size tab 232 produces a template enabling the installer to specify the ratings of the auxiliary current transformers 342 that monitor high amperage current, typically the current in the mains.

Figure 11:
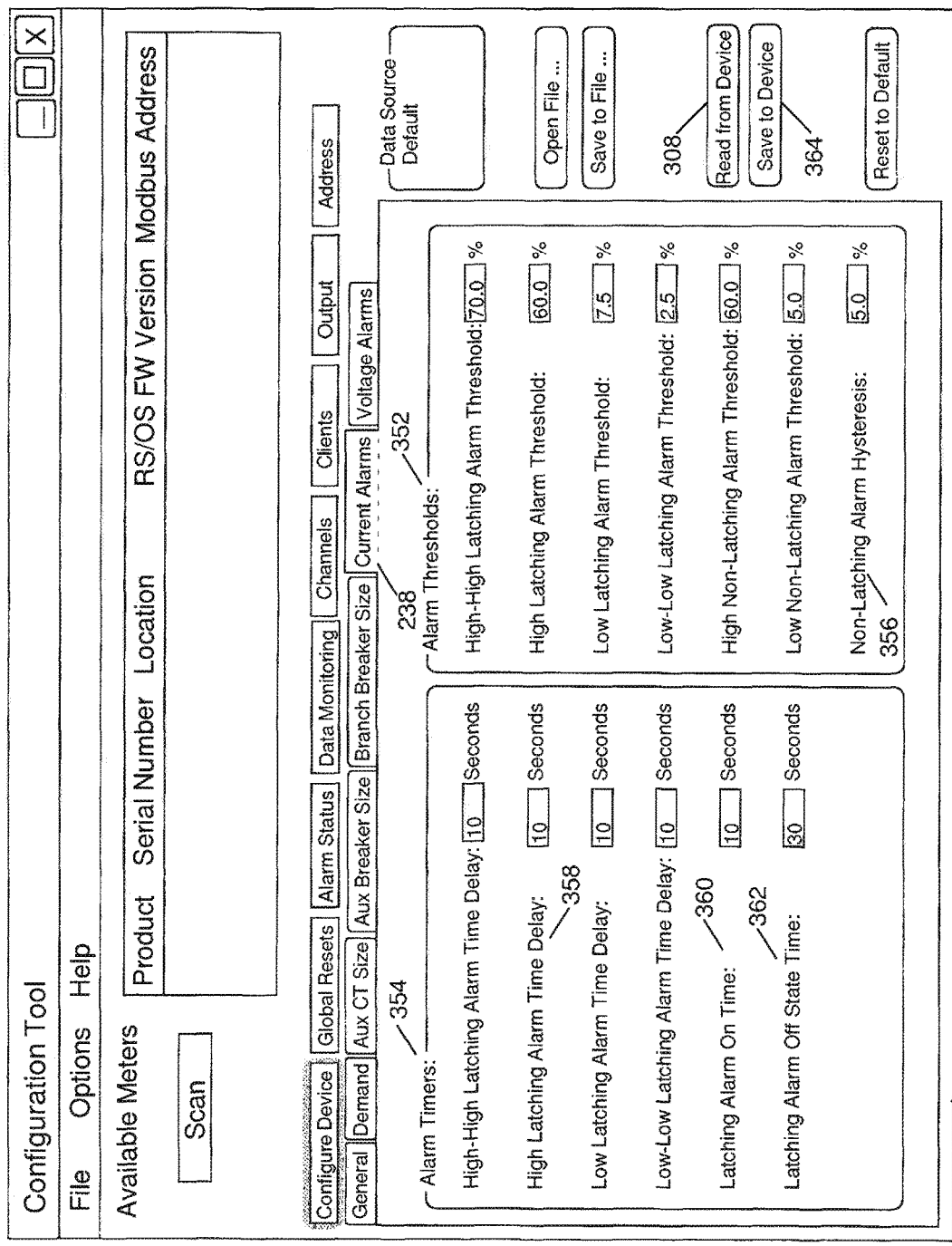
FIG. 11 illustrates a fifth template of the branch current monitor configuration tool of FIG. 7.

Referring to FIG. 11, selecting the Current Alarms tab 238 produces a template enabling the installer to specify the characteristics of the branch current monitor's current alarms 350 and suggests characteristic values for the alarm thresholds 352 and alarm timers 354. The branch current monitor may have both latching and non-latching alarms. If the current crosses a latching alarm threshold, the alarm is activated and will continue to operate until the alarm is manually reset. If the current crosses an alarm threshold for a non-latching alarm, the alarm is initiated, but the alarm will terminate if the current returns to a non-alarm level. A non-latching alarm hysteresis setting 356 specifies a difference between the threshold current for alarm activation and the threshold for alarm deactivation; the amount the current must fall below the high alarm threshold or rise above the low alarm threshold to deactivate the alarm. Hysteresis in the alarm prevents repeated initiation and termination of an alarm as a result of minor fluctuations in a current having a nominal value that is near the alarm threshold. A plurality of alarm current limits, for example, a high latching alarm and a high-high latching alarm having a higher alarm threshold, enables a user to determine the seriousness of a current excursion.

In addition to the alarm thresholds, the installer can specify alarm timers 354 for each of the latching alarms. The time delay 358 is the number of seconds that the current in the circuit must be beyond the respective alarm threshold before the alarm is initiated. The latching alarm on time 360 specifies the time in seconds that the current needs to stay above the low-low alarm threshold before the latching alarms are activated and the latching alarm off time 362 specifies the number of seconds that the current must be less than the low-low alarm threshold before the latching alarms are deactivated. Typical values are provided for the alarm thresholds and alarm timers as default values. The values of any alarms presently specified in the branch current monitor can be retrieved from the monitor's data processing unit by selecting a button 308 and the specified alarm characteristics can be saved to the current monitor by selecting another control button 364.

Figure 12:
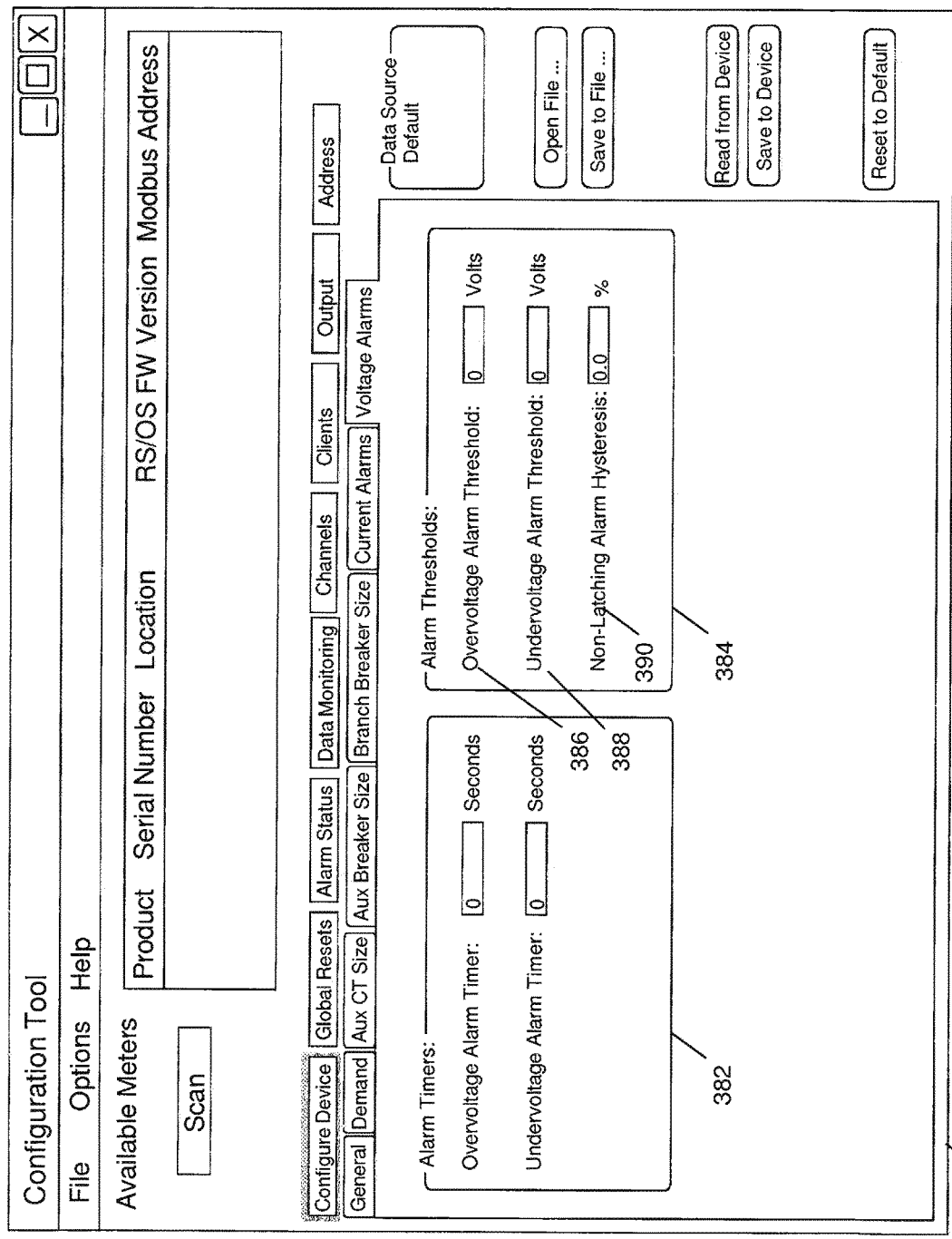
FIG. 12 illustrates a sixth template of the branch current monitor configuration tool of FIG. 7.

Referring to FIG. 12, selecting the voltage alarm tab 240 on the initial display produces a voltage alarm template 380 enabling the installer to specify the alarm delay 382 and alarm thresholds 384 of the branch current monitor's voltage alarms. The alarm timers specify the time intervals that the input voltage must be in an alarm state; i.e. exceeds the over voltage threshold or is less than the under voltage threshold, before the alarm is activated. If the voltage crosses an alarm threshold and then returns to a normal level before the alarm timer interval expires, the alarm timer is reset. The over voltage threshold 386 and the under voltage threshold 388 specify the values of the voltage that will activate the respective voltage alarms. The non-latching alarm hysteresis 390 specifies how much the voltage must fall below the over voltage threshold or rise above the under voltage threshold, as a percentage of the respective alarm threshold voltage, before a voltage alarm will be deactivated.

Figure 13:
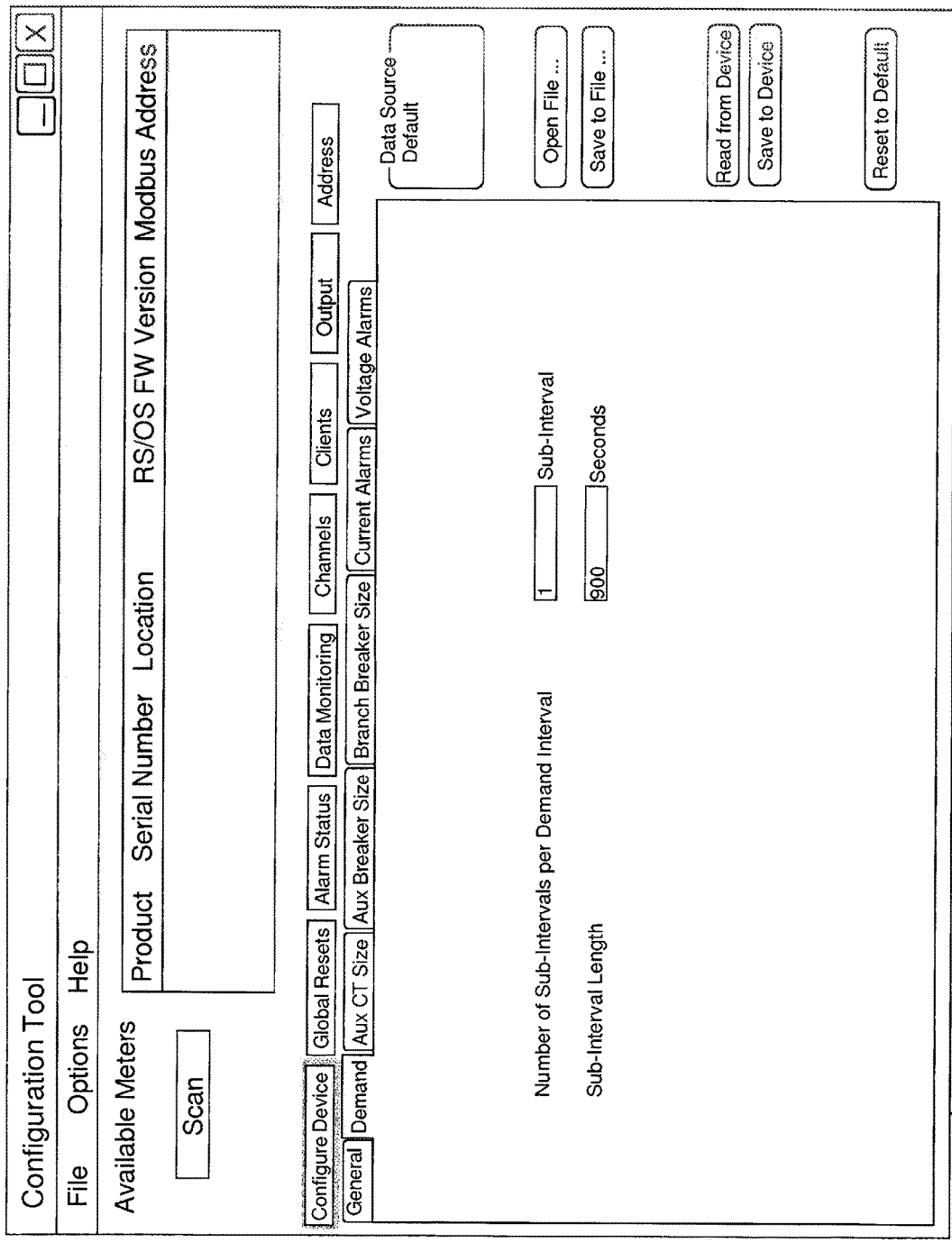
FIG. 13 illustrates a seventh template of the branch current monitor configuration tool of FIG. 7.

Referring to FIG. 13, selecting the Demand tab 230 produces a template 395 enabling the user to specify the interval at which the current and power values will be output. The demand is calculated by summing the average of the subinterval current and power samples divided by the number of subintervals in the specified demand interval. The subinterval average is recalculated every second from the RMS values of the power and current.

Figure 14:
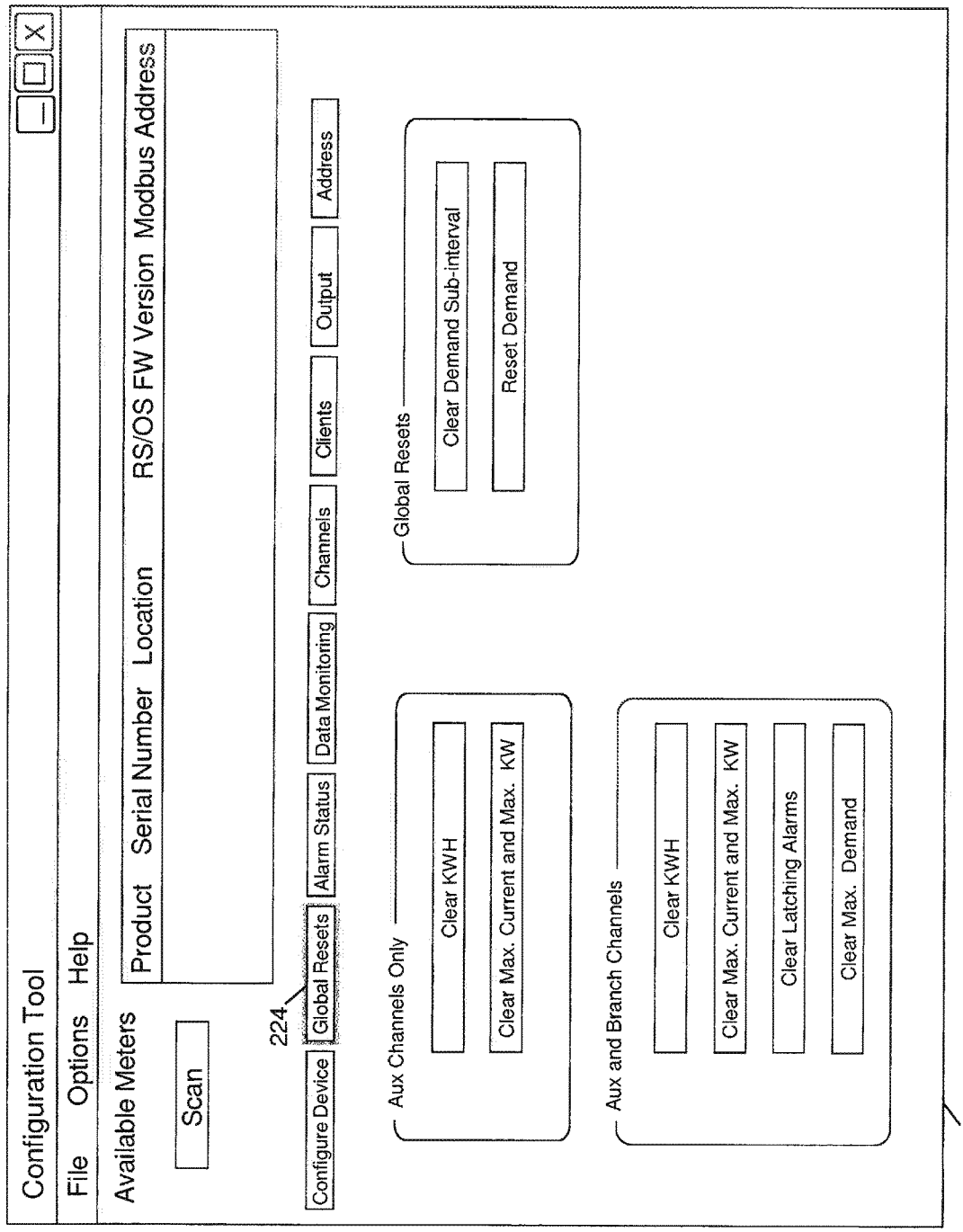
FIG. 14 illustrates an eighth template of the branch current monitor configuration tool of FIG. 7.

Referring to FIG. 14, selecting the global resets button 224 on the initial display produces a template enabling a user to reset all of the registers of the monitor's memory that are storing data produced by the monitor 410.

Figure 15:
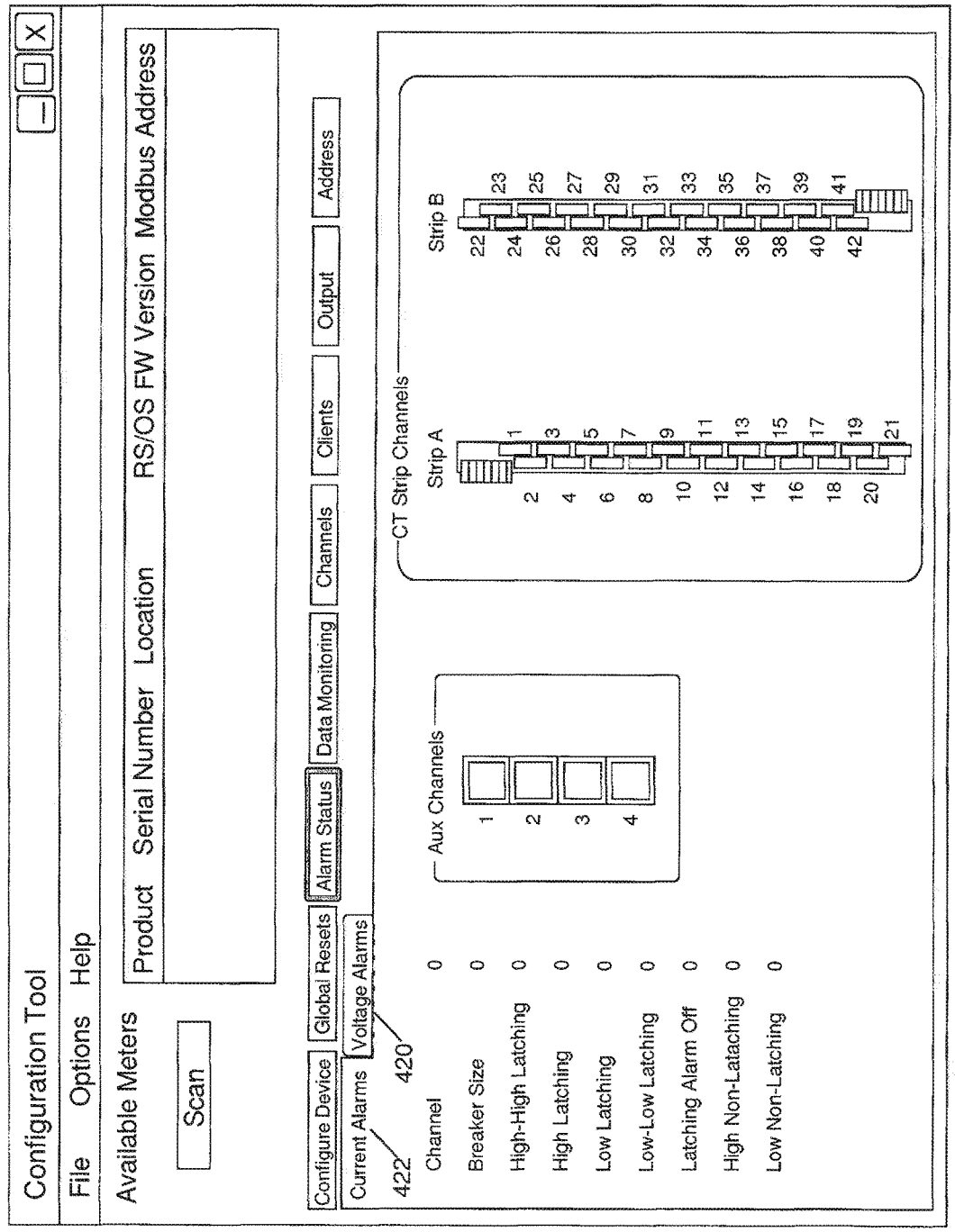
FIG. 15 illustrates a ninth template of the branch current monitor configuration tool of FIG. 7.

Referring to FIG. 15, selecting the alarm status button 326 on the initial display enables displaying the status of the current alarms 422 and the voltage alarms 420. The display identifies the transducer channel in which the alarm is activated, the size of the circuit breaker and the type of alarm.

Figure 16:
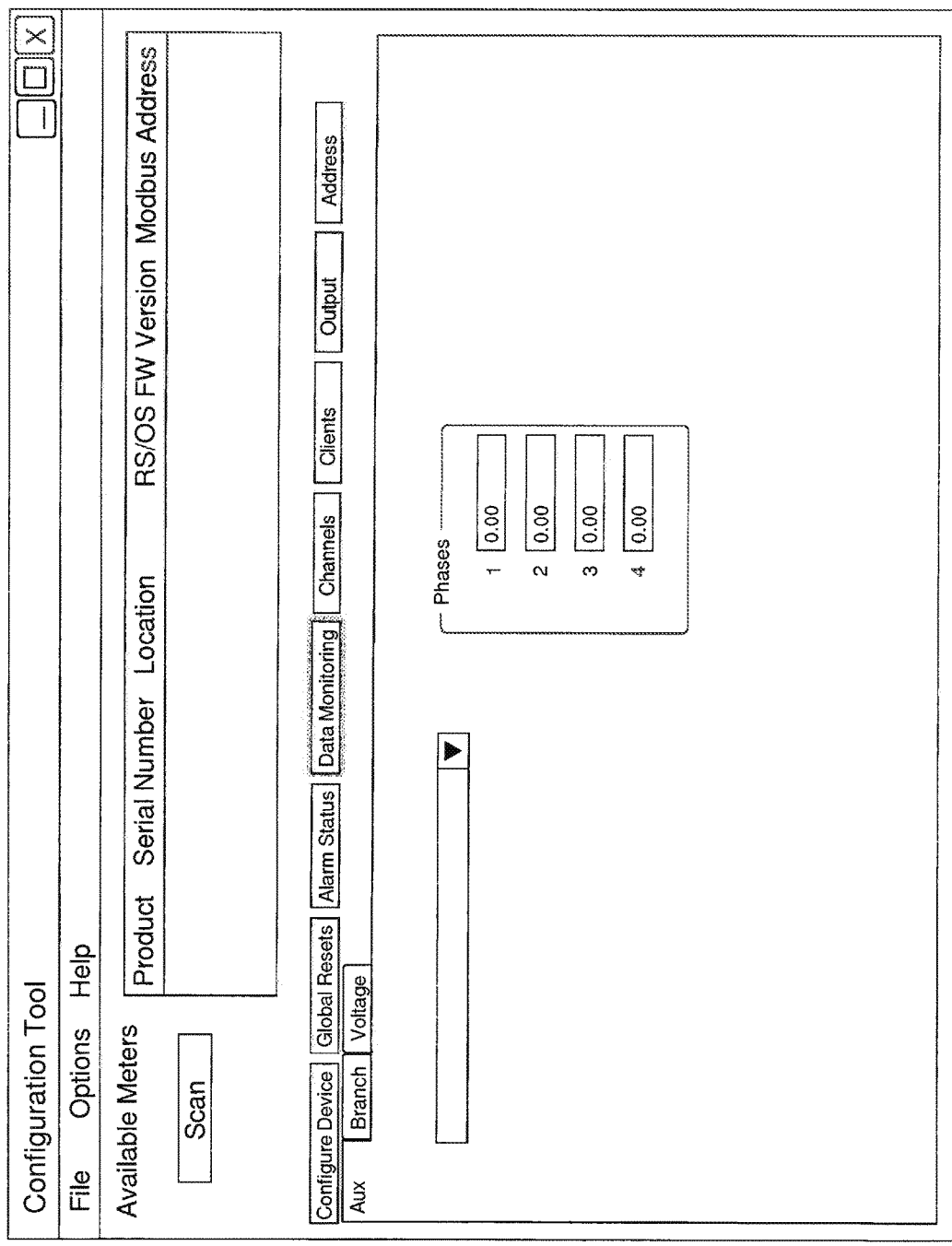
FIG. 16 illustrates a tenth template of the branch current monitor configuration tool of FIG. 7.

Referring to FIG. 16, selecting the data monitoring button 228 displays a template 420 that enables input of descriptive names for the various data channels for use during reporting by the monitor.

Figure 17:
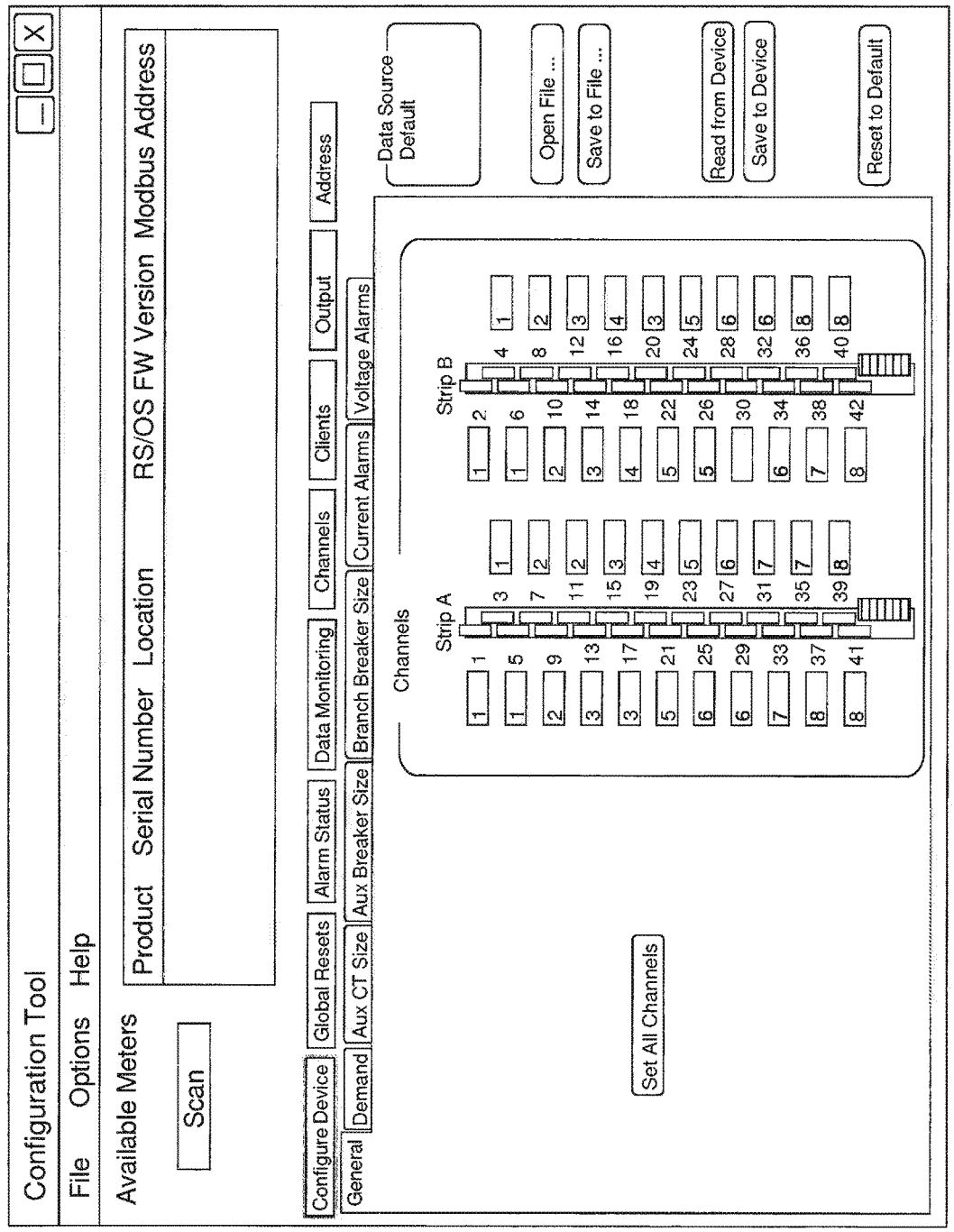
FIG. 17 illustrates an eleventh template of the branch current monitor configuration tool of FIG. 7

Referring to FIG. 17, often in a multi-circuit environment, such as a server farm, different loads will be associated with one phase, two phases, and/or three phases. The installer may group together different current sensors for each load in the form of one phase, two phases, and/or three phases circuits. For example, a number may be included together with each current sensor icon to indicate which circuit it is associate with. In this manner, the power may be determined for each load along with other electrical related parameters. Preferably, the system validates the combination of groups to verify that no more than 3 circuits (or 4 if a neutral is included) are indicated for any particular load.

Figure 18:
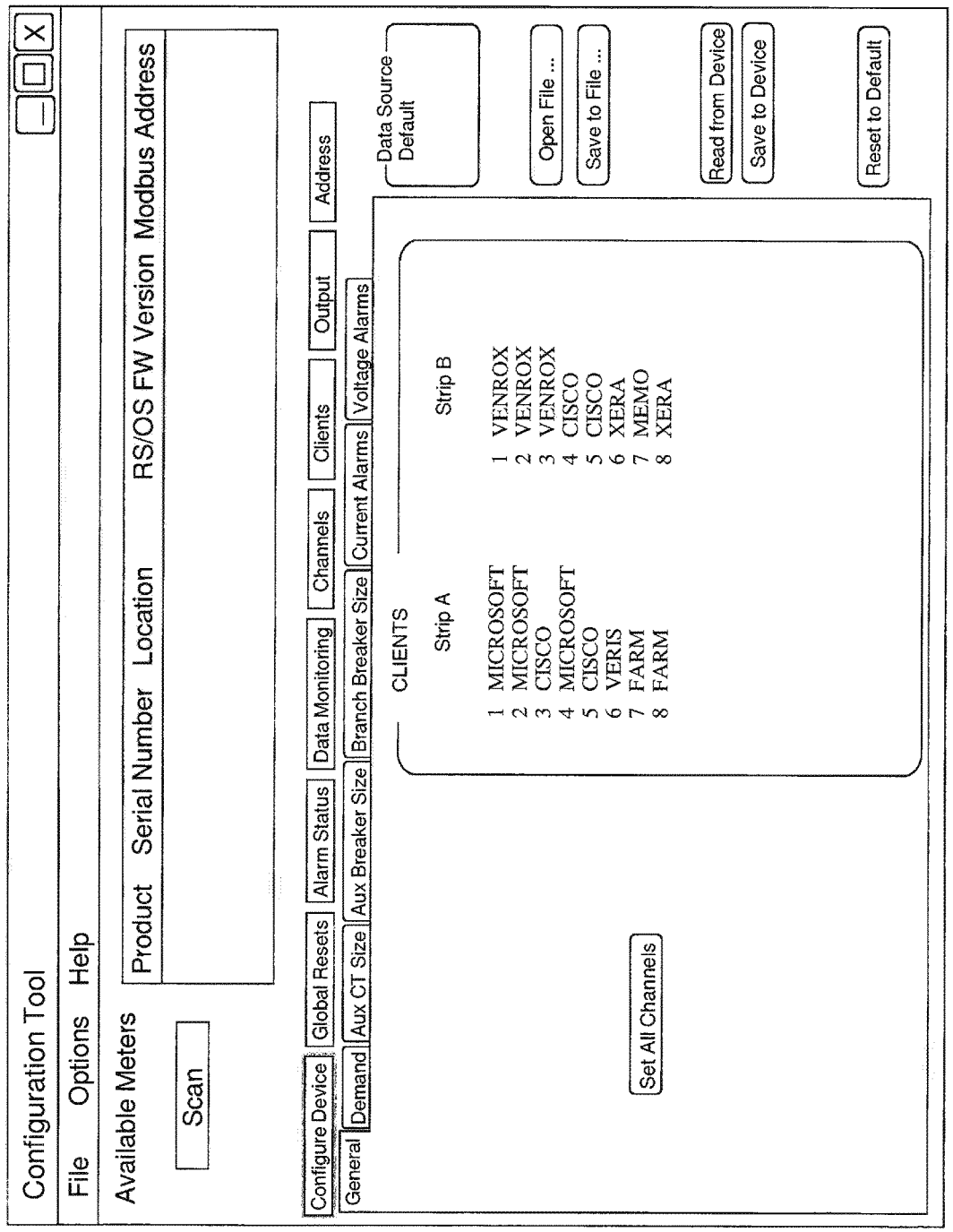
FIG. 18 illustrates a twelfth template of the branch current monitor configuration tool of FIG. 7.

Referring to FIG. 18, it is desirable that the each of the loads identified in FIG. 17 to be provided to the installer, preferably in an organized fashion, such as a corresponding list of client circuits. For each of the loads, the installer may include a textual identification of the client to which the load is associated with. For example, one load may be associated with Microsoft, while a set of other loads may be associated with Cisco, etc. With one or more loads associated with a particular client, the system may readily determine the power usage and other electrical characteristics of a particular client, even those scattered across a plurality of different loads. For example, Cisco may be associated with load 3 and 5 of strip A and load 4 and load 5 of strip B, the combination of which may be associated with Cisco.

Figure 19:
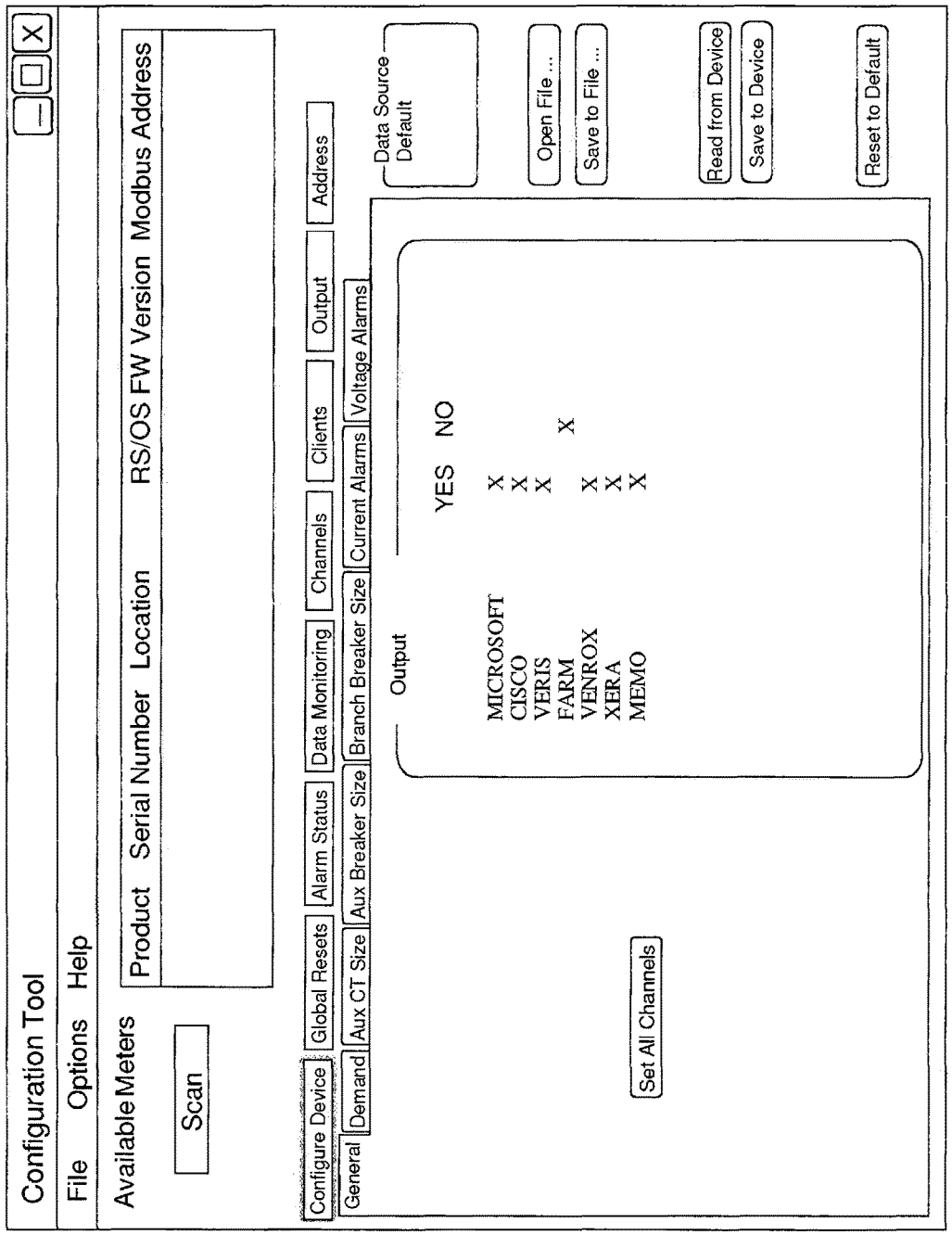
FIG. 19 illustrates a thirteenth template of the branch current monitor configuration tool of FIG. 7.

Referring to FIG. 19, it is desirable to indicate whether a particular client's data should be provided as an output, by a "yes" or a "no" indication. If a client's data should be provided as an output, such as they are a current customer associated with the monitoring system, then the client should be indicated by a "yes". If a client is no longer a client associated with a particular monitoring system, such as the client is no longer associated with particular servers of a server farm, then should be indicated by a "no". In this manner, the system may be aware that the determining or otherwise providing the power for the particular circuits associated with the particular client is no longer necessary.

In many cases it is cumbersome and complicated to access the registers of a particular device by using the Modbus protocol together with selecting the appropriate registers for a particular client. For example, for one client it may require accessing a significant number of different registers to obtain the desired information, namely, the power usage of that client scattered across a significant number of registers. The registers of the system may be configured such that the total of a plurality of circuits, such as the total power usage for a client associated with several loads, may be contained within a single or a selected group of registers. While this is of some benefit, often data associated with a previous client will be obtained which has no particular relevance for selected purposes, such as billing. Also, often data for other clients is obtained unknowingly when the allocation of the loads change over time. Accordingly, after obtaining such information from selected register(s) a previous client, which is no longer a current client, will be inadvertently billed. To reduce the confusion associated with a multitude of register configurations for an ever changing set of clients and the loads which are associated with the ever changing set of clients, it is desirable to logically separate the "single" device into a plurality of different Modbus addresses. Each of the different Modbus addresses is preferably associated with a single client.

Figure 20:
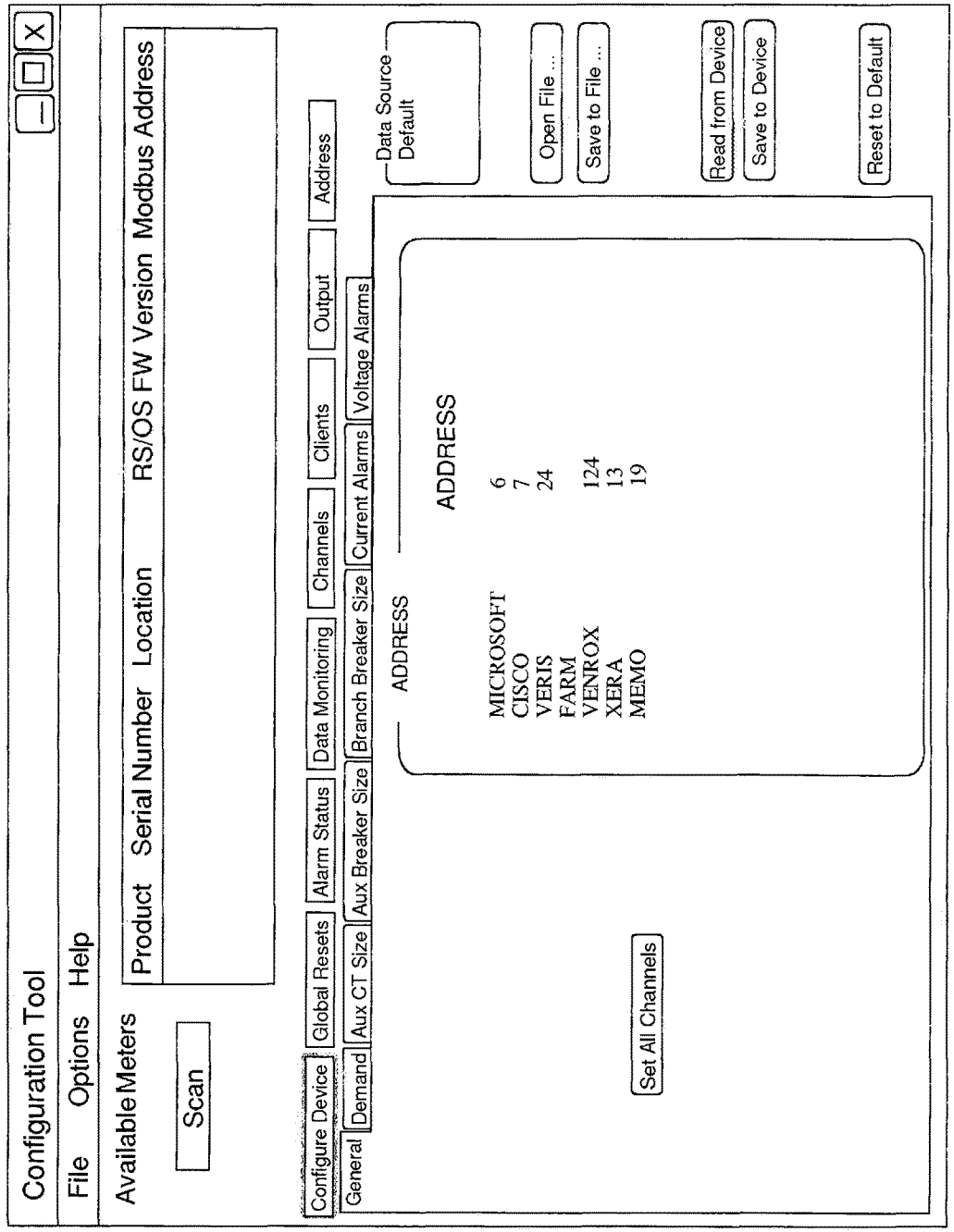
FIG. 20 illustrates a fourteenth template of the branch current monitor configuration tool of FIG. 7.

Referring to FIG. 20, the single device may associate a different Modbus address with a particular client. The installer may select the Modbus address or otherwise the system may automatically assign a suitable Modbus address. In this manner, each client will have a uniquely associated Modbus address that is available on the network from which to obtain data, preferably for all their loads. The registers associated with a particular Modbus address may be arranged in such a fashion that is consistent, at least in part, among the different Modbus addresses for each of the clients. For example, the first register may be associated with the total power usage so that for each client (aka Modbus address) the total power usage may be readily obtained which is especially useful for billing purposes. When a client becomes a previous client and therefore additional billing is no longer desirable, the Modbus address may be simply removed or the output may be changed to "no" which effectively removes the ability to address the Modbus address. In this manner, the data associated with the previous Modbus address will no longer be externally available using that Modbus address. Further, by simple modification of the client identification, the associated loads may be readily reassigned in a straightforward manner.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

The invention claimed is:

1. A metering system comprising:
   (a) a branch current meter that includes a plurality of addresses therein which receives sensed signals representative of electrical characteristics from a set of current transformers and provides electrical sensor data representative of said electrical characteristics of said set of current transformers to a computing device;
   (b) said computing device graphically displaying on a graphical user interface a first graphical representation of a first series of first current transformers of said branch current meter, where the total number of said first series of current transformers is consistent with the total number of said set of current transformers;
   (c) said computing device displaying together with said first graphical representation of said first series of said first current transformers a configurable assignment of each of said first current transformers to a first plurality of groups where each group of said first plurality of groups is associated with a different load, where at least a first group of said first plurality of groups includes a first plurality of said first current transformers each assigned with a first same said configurable assignment, where at least a second group of said first plurality of groups includes a second plurality of said first current transformers each assigned with a second same said configurable assignment, where at least a third group of said first plurality of groups includes a third plurality of said first current transformers each assigned with a third same said configurable assignment, where said first group, said second group, and said third group are different from one another;
   (d) said computing device assigning a first client to said first same configurable assignment, a second client to said second same configurable assignment, and a third client to said third same configurable assignment, wherein said first client, said second client, and said third client are different from one another;
   (e) said computing device assigning a first selection for said first client indicating whether to provide an output for said first client, assigning a second selection for said second client indicating whether to provide an output for said second client, and assigning a third selection for said third client indicating whether to provide an output for said third client;
   (f) said computing device assigning a first single address to said first client, a second single address to said second client, and a third single address to said third client, where said first address, said second address, and said third address are different from another;
   (g) said branch current meter programming said first single address of said branch current meter for said first client with data representative of a combination of said first group of said first plurality of groups, said second single address of said branch current meter for said second client with data representative of a combination of said second group of said first plurality of groups, said third single address of said branch current meter for said third client with data representative of a combination of said third group of said first plurality of groups;
   (h) said computing device selectively providing data from said first single address of said branch current meter as an output depending upon said first selection, selectively providing data from said second single address of said branch current meter as an output depending upon said second selection, and selectively providing data from said third single address of said branch current meter as an output depending upon said third selection, where said first selection, said second selection, and said third selection selectively indicates to either provide such data and not provide such data.

2. The metering system of claim 1 further comprising: (a) displaying on said graphical user interface a second graphical representation of a second series of second current transformers; (b) displaying together with said second graphical representation of said second series of said second current transformers a configurable assignment of each of said second current transformers to a second plurality of groups where each of said second plurality of groups is associated with a different load.

3. The metering system of claim 1 wherein each of said first plurality of groups is representative of a single phase circuit, a two phase circuit, and a three phase circuit.

4. The metering system of claim 1 wherein a corresponding textual identification indicating a client is associated with each of said first plurality of groups.

5. The metering system of claim 4 wherein said corresponding textual identification includes at least two different clients.

6. The metering system of claim 5 wherein said corresponding textual identification indicates whether an output of electrical usage associated with the respective client should be provided as an output.

7. The metering system of claim 6 where when said respective client is not indicated a previously addressable address is no longer externally assessable.

* * * * *